United States Patent
Kuriyama et al.

(10) Patent No.: US 8,252,167 B2
(45) Date of Patent: Aug. 28, 2012

(54) PLATING APPARATUS

(75) Inventors: Fumio Kuriyama, Tokyo (JP); Takashi Takemura, Tokyo (JP); Nobutoshi Saito, Tokyo (JP); Masaaki Kimura, Tokyo (JP); Rei Kiumi, Tokyo (JP)

(73) Assignee: Ebara Corporation, Tokyo (JP)

( * ) Notice: Subject to any disclaimer, the term of this patent is extended or adjusted under 35 U.S.C. 154(b) by 115 days.

(21) Appl. No.: 12/966,297

(22) Filed: Dec. 13, 2010

(65) Prior Publication Data

US 2011/0073482 A1 Mar. 31, 2011

Related U.S. Application Data

(62) Division of application No. 10/538,507, filed as application No. PCT/JP2004/003040 on Mar. 9, 2004, now Pat. No. 7,875,158.

(30) Foreign Application Priority Data

Mar. 11, 2003 (JP) .................................. 2003-65476
Aug. 21, 2003 (JP) ................................ 2003-208315

(51) Int. Cl.
C25D 7/00 (2006.01)
C25D 17/00 (2006.01)
C25B 9/00 (2006.01)

(52) U.S. Cl. ........ 205/148; 205/668; 205/670; 205/671; 366/241; 366/341; 366/342

(58) Field of Classification Search .................. 205/148, 205/668, 670, 671; 366/241, 341, 342
See application file for complete search history.

(56) References Cited

U.S. PATENT DOCUMENTS

| 5,421,987 | A | 6/1995 | Tzanavaras et al. |
| 5,683,564 | A | 11/1997 | Reynolds |
| 6,071,388 | A | 6/2000 | Uzoh |
| 6,875,333 | B2 | 4/2005 | Sakaki |
| 7,294,244 | B2 | 11/2007 | Oberlitner et al. |
| 7,390,383 | B2 | 6/2008 | McHugh et al. |
| 2002/0027080 | A1 | 3/2002 | Yoshioka et al. |
| 2002/0153246 | A1 | 10/2002 | Wang |
| 2003/0153185 | A1 | 8/2003 | Sakaki |

FOREIGN PATENT DOCUMENTS

| EP | 1 167 583 | 1/2002 |
| EP | 1 174 912 | 1/2002 |
| JP | 7-210823 | 8/1995 |

OTHER PUBLICATIONS

International Search Report issued Apr. 8, 2005 in International (PCT) Application No. PCT/JP2004/003040.

*Primary Examiner* — Harry D Wilkins, III
*Assistant Examiner* — Zulmariam Mendez
(74) *Attorney, Agent, or Firm* — Wenderoth, Lind & Ponack, LLP.

(57) ABSTRACT

A plating apparatus for use in forming a plated film in trenches, via holes, or resist openings that are defined in a surface of a semiconductor wafer, and forming bumps to be electrically connected to electrodes of a package, on a surface of a semiconductor wafer. The plating apparatus has a plating tank for holding a plating solution, a holder for holding a workpiece and bringing a surface to be plated of the workpiece into contact with the plating solution in the plating tank, and a ring-shaped nozzle pipe disposed in the plating tank and having a plurality of plating solution injection nozzles for injecting the plating solution to the surface to be plated of the workpiece held by the holder to supply the plating solution into the plating tank.

14 Claims, 27 Drawing Sheets

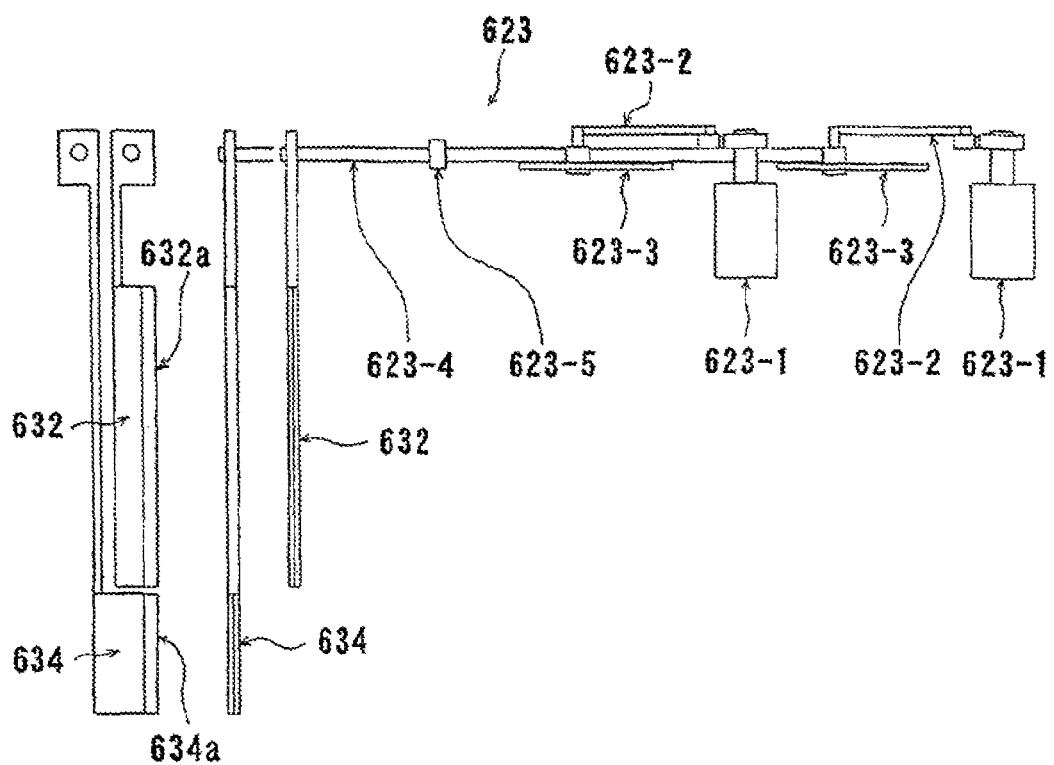

F I G. 23
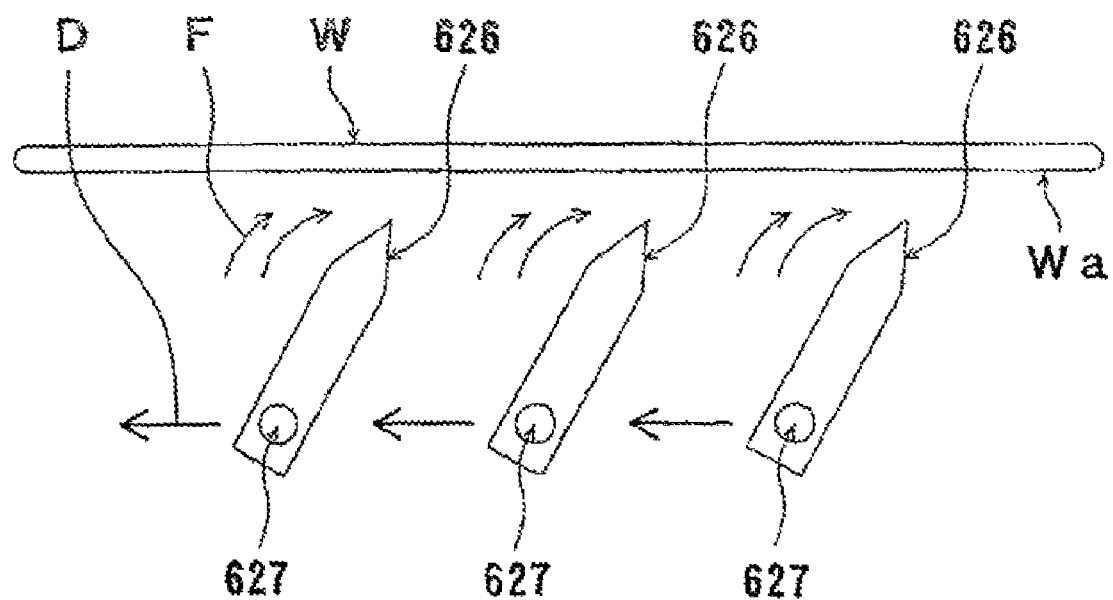

F I G. 24
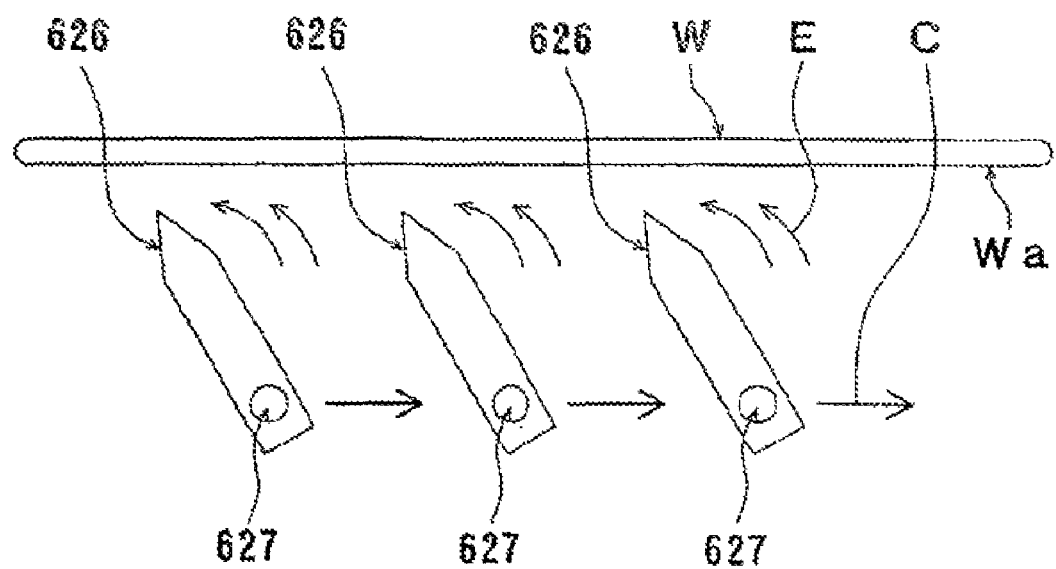

F I G. 26
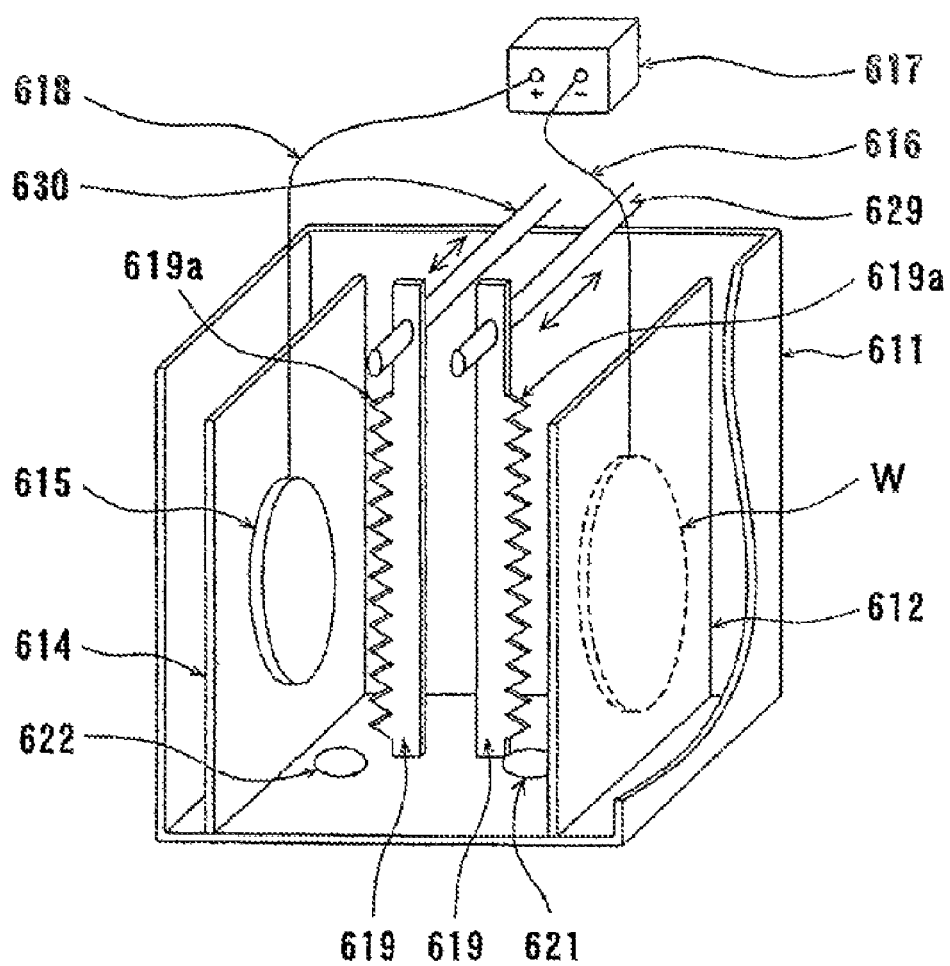

PLATING APPARATUS

CROSS REFERENCE

This application is a divisional application of Ser. No. 10/538,507, filed Jun. 9, 2005 now U.S. Pat. No. 7,875,158, which is a National Stage application of International application No. PCT/JP2004/003040, filed Mar. 9, 2004.

BACKGROUND OF THE INVENTION

1. Technical Field

The present invention relates to a plating apparatus for plating a surface (a surface to be plated) of a substrate or the like, and more particularly to a plating apparatus for use in forming a metal film and interconnects on a substrate for LSI circuits or the like according to plating technology, forming a plated film in fine interconnect grooves (trenches), via holes, or resist openings that are defined in a surface of a semiconductor wafer or the like, and forming bumps (protruding electrodes) to be electrically connected to electrodes of a package or the like, on a surface of a semiconductor wafer.

2. Background Art

In recent years, a method of forming interconnects or bumps in semiconductor circuits by forming metallic films on silicon wafers or other substrates according to plating technology has been employed.

In TAB (Tape Automated Bonding) or FC (Flip Chip), for example, it has widely been practiced to form protruding connecting electrodes (bumps) of gold, copper, solder, lead-free solder, or nickel, or a multi-layer laminate of these metals at predetermined portions (electrodes) on a surface of a semiconductor chip having interconnects formed therein, and to electrically connect the interconnects via the bumps with electrodes of a package or TAB electrodes. Methods of forming bumps include various methods, such as electroplating, vapor deposition, printing, and ball bumping. With a recent increase in the number of I/O in a semiconductor chip and a trend toward finer pitches, electroplating has more frequently been employed because it can cope with fine processing and has relatively stable performance.

In particular, metallic films produced by electroplating are advantageous in that they are highly pure, can be grown at high speeds, and have their thicknesses easily controlled. Electroless plating, on the other hand, is advantageous in that the number of steps required to form interconnects or bumps may be small as a seed layer for passing a current on a workpiece to be plated such as a substrate or the like is not required. Since a film formed on a semiconductor substrate is strictly required to be of uniform thickness, many attempts have been made to meet such a requirement in the above plating processes.

FIG. 27 shows an example of a conventional electroless plating apparatus which employs a so-called face-down method. The electroless plating apparatus has an upwardly opened plating tank 12 for holding a plating solution (electroless plating solution) 10 therein, and a vertically movable substrate holder 14 for detachably holding a substrate W as a workpiece to be plated in a state such that a front face (surface to be plated) of the substrate W faces downward (face-down). An overflow tank 16 is provided around an upper portion of the plating tank 12, and a plating solution discharge line 18 is connected to the overflow tank 16. Further, a plating solution supply nozzle 22 is provided at the bottom of the plating tank 12 and connected to the plating solution supply line 20.

In operation, a substrate W held horizontally by the substrate holder 14 is located at a position such as to close an opening at an upper end of the plating tank 12. In this state, the plating solution 10 is supplied from the plating solution supply nozzle 22 into the plating solution tank 12 and allowed to overflow the upper portion of the plating tank 12, thereby flowing the plating solution 10 along a surface of the substrate W held by the substrate holder 14, and returning to a circulation tank (not shown) through the plating solution discharge line 18. Thus, by bringing the plating solution into contact with a pretreated surface of the substrate W, metal is deposited on the surface of the substrate W so as to form a metal film.

According to the plating apparatus, uniformity of the thickness of the metal film formed on the surface of the substrate W can be adjusted to a certain extent by adjusting the supply rate of the plating solution 10 supplied from the plating solution supply nozzle 22, and rotating the substrate holder 14, and the like.

FIG. 28 shows an example of a conventional electroplating apparatus which employs a so-called dipping method. The electroplating apparatus has a plating tank 12a for holding a plating solution (electroplating solution) therein, and a vertically movable substrate holder 14a for detachably holding a substrate W in a state such that a front face (surface to be plated) is exposed while a peripheral portion of the substrate W is water-tightly sealed. An anode 24 is held by an anode holder 26 and disposed vertically within the plating tank 12a. Further, a regulation plate 28 made of a dielectric material having a central hole 28a is disposed in the plating tank 12a so as to be positioned between the anode 24 and the substrate W when the substrate W held by the substrate holder 14a is disposed at a position facing the anode 24.

In operation, the anode 24, the substrate W, and the regulation plate 28 are immersed in the plating solution in the plating tank 12a. Simultaneously, the anode 24 is connected via a conductor 30a to an anode of a plating power supply 32, and the substrate W is connected via a conductor 30b to a cathode of the plating power supply 32. Thus, due to a potential difference between the substrate W and the anode 24, metal ions in the plating solution receive electrons from the surface of the substrate W, so that metal is deposited on the surface of the substrate W so as to form a metal film.

According to the plating apparatus, the variation of the thickness of the metal film formed on the surface of the substrate W can be adjusted to a certain extent by disposing the regulation plate 28 having the central hole 28a between the anode 24 and the substrate W disposed at a position facing the anode 24, and adjusting a potential distribution on the plating tank 12a with the regulation plate 28.

FIG. 29 shows another example of a conventional electroplating apparatus which employs a so-called dipping method. The electroplating apparatus differs from the electroplating apparatus shown in FIG. 28 in that a ring-shaped dummy cathode (dummy electrode) 34 is provided instead of a regulation plate, that a substrate W is held by a substrate holder 14a in a state such that the dummy cathode 34 is disposed around the substrate W, and that the dummy cathode 34 is connected via a conductor 30c to a cathode of a plating power supply 32 during plating.

According to the plating apparatus, uniformity of thickness of a plated film formed on the surface of the substrate W can be improved by adjusting an electric potential of the dummy cathode 34.

FIG. 30 shows still another conventional electroplating apparatus which employs a so-called dipping method. The electroplating apparatus differs from the electroplating apparatus shown in FIG. 28 in that there is no regulation plate, a paddle shaft (stirring mechanism) 36 is positioned above a plating tank 12a and disposed parallel to and between a substrate holder 14*a* and an anode 24, and a plurality of paddles (stirring rods) 38 are suspended substantially vertically as stirring vanes from a lower surface of the paddle shaft 36, the arrangement being such that, during a plating process, the paddle shaft 36 reciprocally moves the paddles 38 parallel to a substrate W, thereby stirring a plating solution in the plating tank 12*a*.

According to the plating apparatus, the paddle shaft 36 reciprocally moves the paddles 38 parallel to the substrate W to uniformize flows of the plating solution (i.e., to eliminate the directivity of flows of the plating solution) along the surface of the substrate W over the entire surface of the substrate W for thereby forming a plated film of more uniform thickness over the entire surface of the substrate W.

For forming a metal film (plated film) as interconnects or bumps on a surface of a semiconductor substrate (wafer), for example, the surface configuration and film thickness of the metal film formed over the entire surface of the substrate are required to be uniform. While highly dense packaging technologies such as SOC, WL-CSP, etc. available in recent years require more highly accurate uniformity, it would be highly difficult for the conventional plating apparatus to produce a metal film that meets the requirements for such highly accurate uniformity.

Specifically, each of the conventional plating apparatuses has its own structural features that result in the film thickness variation characteristics of a plated film formed thereby, and to produce a plated film having better film thickness uniformity, improvement of the plating apparatus is required. For producing a plated film of uniform film thickness, it is effective to uniformize flows of the plating solution near a surface to be plated of a substrate or the like. There is a demand for a process of making a uniform flow of plating solution and bringing the plating solution into contact with a surface to be plated of a substrate or the like. Plating apparatus themselves are also required to have a simple structure and mechanism designed for easy maintenance. For example, the plating apparatus shown in FIG. 29 needs to be operated so as to adjust a dummy electrode and remove plated metal that has been deposited on the dummy electrode. It has been desired to handle the plating apparatus better and manage the plating apparatus simply and without the problems of operation and management complexities. For shortening the plating time, it is very desirable to increase the plating speed. Increasing the plating speed requires supplying metal ions in the plating solution efficiently to a surface to be plated of a substrate or the like.

In electroplating, one approach to increase the plating speed would be to increase the current density. However, simply increasing the current density would cause burnt deposits, plating defects, passivation of the anode surface, etc., possibly resulting in plating failures.

BRIEF SUMMARY OF THE INVENTION

The present invention has been made in view of the above drawbacks. It is, therefore, a first object of the present invention to provide a plating apparatus which is capable of increasing the plating speed and adjusting flows of a plating solution more uniformly in a plating tank to achieve higher within-wafer uniformity of the film thickness of a plated film with a relatively simple arrangement.

It is a second object of the present invention to provide a plating apparatus which is capable of forming a plated film having better film thickness uniformity on a surface to be plated of a workpiece with a relatively simple arrangement and without needs for a complicated operation and setting.

To achieve the above objects, a plating apparatus, comprising: a plating tank for holding a plating solution is provided a holder for holding a workpiece and bringing a surface to be plated of the workpiece into contact with the plating solution in the plating tank, and a ring-shaped nozzle pipe disposed in the plating tank and having a plurality of plating solution injection nozzles for injecting the plating solution toward the surface to be plated of the workpiece held by the holder to supply the plating solution into the plating tank.

According to the present invention, the plating solution is injected from the plating solution injection nozzles formed on the ring-shaped nozzle pipe and applied as strong streams to the surface to be plated of the workpiece, thereby efficiently supplying ions in the plating solution to the surface to be plated of the workpiece while preventing the uniformity of the potential distribution on the entire surface to be plated of the workpiece from being disturbed. The plating speed is thus increased without degrading the quality of the plated film. In addition, the uniformity of the film thickness of the plated film can be increased by adjusting the flow rate and direction of the plating solution injected from the plating solution injection nozzles in order to provide a more uniform flow of the plating solution near the surface to be plated of the workpiece.

Streams of the plating solution injected from the plating solution injection nozzles should preferably join each other on or in front of a substantially central area of the surface to be plated of the workpiece held by the holder.

Since the joined flow of the plating solution is applied perpendicularly to the substantially central area of the surface to be plated of the workpiece, and thereafter changes its direction to spread outwardly along the surface to be plated of the workpiece, the flow of the plating solution after it has impinged upon the surface to be plated of the workpiece is prevented from interfering with a discharged flow of the plating solution, and hence is formed as a constant continuous and stable flow.

The plating apparatus may comprise an electroplating apparatus having an anode, and a plating voltage may be applied between the anode and the workpiece to perform electroplating on the workpiece.

If the plating apparatus comprises an electroplating apparatus having an anode, then the plating apparatus should preferably further comprise a plating solution injection nozzle for injecting the plating solution toward the anode to supply the plating solution into the plating tank.

The rate at which the anode is dissolved is increased to make it possible to dissolve the anode at a rate commensurate with an increase in the electroplating speed.

The plating apparatus may comprise an electroless plating apparatus for bringing an electroless plating solution into contact with the surface to be plated of the workpiece to perform electroless plating on the workpiece.

The workpiece may be disposed horizontally or vertically.

The nozzle pipe may be shaped to extend along an outer profile of the workpiece. For example, if the workpiece has a circular outer profile, then the nozzle pipe should comprise a circular ring-shaped nozzle pipe. If the workpiece has a rectangular outer profile, then the nozzle pipe should comprise a rectangular ring-shaped nozzle pipe.

The nozzle pipe should preferably be movable relative to the workpiece held by the holder. With this arrangement, the nozzle pipe may be moved in forward and backward directions, leftward and rightward directions, or upward and downward directions, or in a combination of these directions, with respect to the surface to be plated of the workpiece, or may be moved in a circular pattern in a plane parallel to the surface to be plated of the workpiece, or the nozzle pipe may make a swiveling motion, for further increasing the uniformity of the film thickness of the plated film.

The nozzle pipe and/or the plating solution injection nozzles should preferably be made of an electrically insulating material. The nozzle pipe and/or the plating solution injection nozzles which are made of an electrically insulating material are effective to prevent the electric field distribution in the plating tank from being disturbed thereby.

According to the present invention, there is also provided a plating apparatus, comprising: a plating tank for holding a plating solution; and a stirring mechanism having a stirring vane immersed in the plating solution in the plating tank and disposed in a position facing a surface to be plated of a workpiece, the stirring vane being reciprocally movable parallel to the surface to be plated of the workpiece to stir the plating solution; wherein the stirring vane has irregularities on at least one side thereof.

According to the above arrangement, the stirring vane with the irregularities on at least one side thereof is capable of generating many swirls uniformly and generally in the plating solution when the stirring vane is reciprocally moved. Thus, the flow of the plating solution that is in contact with the surface to be plated of the workpiece is more uniformly and effectively applied to form a plated film having better film thickness uniformity on the surface to be plated of the workpiece.

The irregularities comprise, for example, a succession of triangular or rectangular saw-tooth irregularities or a number of narrow grooves defined at predetermined intervals.

Since the irregularities comprise a succession of triangular or rectangular saw-tooth irregularities or a number of narrow grooves defined at predetermined intervals, many swirls are produced uniformly and generally in the plating solution when the stirring vane is reciprocally moved. Thus, the flow of the plating solution that is in contact with the surface to be plated of the workpiece is more uniformly and effectively applied to form a plated film having better film thickness uniformity on the surface to be plated of the workpiece.

Preferably, the side of the stirring vane with the irregularities provided thereon faces the surface to be plated of the workpiece.

Inasmuch as the side of the stirring vane with the irregularities provided thereon faces the surface to be plated of the workpiece, many swirls are produced uniformly and generally in the plating solution when the stirring vane is reciprocally moved. Thus, the flow of the plating solution that is in contact with the surface to be plated of the workpiece is more uniformly and effectively applied to form a plated film having better film thickness uniformity on the surface to be plated of the workpiece.

The stirring mechanism should preferably have a plurality of the stirring vanes.

If the stirring mechanism has a plurality of the stirring vanes, then more swirls are produced uniformly and generally in the plating solution near the surface to be plated of the workpiece when the stirring vane is reciprocally moved. Thus, the flow of the plating solution that is in contact with the surface to be plated of the workpiece is more uniformly and effectively applied to form a plated film having better film thickness uniformity on the surface to be plated of the workpiece.

According to the present invention, there is further provided a plating apparatus, comprising: a plating tank for holding a plating solution; and a stirring mechanism having a stirring vane immersed in the plating solution in the plating tank for stirring the plating solution; wherein the stirring vane comprises a plurality of stirring vanes which are actuatable by respective independent drive mechanisms.

According to the above arrangement, since the stirring vane comprises a plurality of stirring vanes having respective independent drive mechanisms, the stirring distribution of the plating solution can be adjusted to form a plated film having better film thickness uniformity on the surface to be plated of the workpiece.

Preferably, the stirring vanes are different in shape from each other.

Since the stirring vanes of the stirring mechanisms are different in shape from each other, the stirring distribution of the plating solution can be adjusted to form a plated film having better film thickness uniformity on the surface to be plated of the workpiece.

Preferably, the stirring vanes are reciprocally movable in directions parallel to a surface to be plated of a workpiece.

Because the stirring vanes are reciprocally movable in directions parallel to a surface to be plated of a workpiece, the stirring distribution of the plating solution can be adjusted to form a plated film having better film thickness uniformity on the surface to be plated of the workpiece.

According to the present invention, there is also provided a plating apparatus, comprising: a plating tank for holding a plating solution; and a stirring mechanism having a stirring vane immersed in the plating solution in the plating tank and disposed in a position facing a surface to be plated of a workpiece, the stirring vane being reciprocally movable parallel to the surface to be plated of the workpiece to stir the plating solution; wherein the stirring vane has an angle with respect to the surface to be plated of the workpiece, the angle being variable as the direction in which the stirring vane moves is changed.

According to the above arrangement, the angle of the stirring vane with respect to the surface to be plated of the workpiece is changed as the direction in which the stirring vanes moves is changed, thus producing a flow of the plating solution uniformly and generally. Thus, the flow of the plating solution that is in contact with the surface to be plated of the workpiece is more uniformly and effectively applied to form a plated film having better film thickness uniformity on the surface to be plated of the workpiece.

The stirring mechanism should preferably have a plurality of the stirring vanes.

With the plural stirring vanes used, a flow of the plating solution is produced uniformly and generally when the stirring vanes are reciprocally moved. Thus, the flow of the plating solution that is in contact with the surface to be plated of the workpiece is more uniformly and effectively applied to form a plated film having better film thickness uniformity on the surface to be plated of the workpiece.

According to the present invention, there is also provided a plating apparatus, comprising: a plating tank for holding a plating solution; an anode immersed in the plating solution in the plating tank and disposed in a position facing a surface to be plated of a workpiece; and a stirring mechanism for stirring the plating solution in the plating tank; wherein the stirring mechanism has a first stirring vane disposed closely to the surface to be plated of the workpiece and a second stirring vane disposed closely to the anode.

According to the above arrangement, the stirring mechanism has the first stirring vane disposed close to the surface to be plated of the workpiece and the second stirring vane disposed close to the anode. When the first and second stirring vanes are moved, a flow of the plating solution is produced close to the surface to be plated of the workpiece and the anode. The flow of the plating solution that is in contact with the surface to be plated of the workpiece is more uniformly and effectively applied to form a plated film having better film thickness uniformity on the surface to be plated of the workpiece.

Preferably, the first stirring vane is reciprocally movable parallel to the surface to be plated of the workpiece, and the second stirring vane is reciprocally movable parallel to a surface of the anode which faces the surface to be plated of the workpiece.

When the first stirring vane is reciprocally moved parallel to the surface to be plated of the workpiece, and the second stirring vane is reciprocally moved parallel to a surface of the anode which faces the surface to be plated of the workpiece, a flow of the plating solution is produced close to the surface to be plated of the workpiece and the anode. The flow of the plating solution that is in contact with the surface to be plated of the workpiece is more uniformly and effectively applied to form a plated film having better film thickness uniformity on the surface to be plated of the workpiece.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 21A is a side view of yet another stirring mechanism;

FIG. 21B is a front view of the yet another stirring mechanism;

FIG. 23 is a view showing the relationship between a direction of motion of the stirring vane shown in FIG. 22 and an angle of the stirring vane with respect to a surface to be plated of a workpiece;

FIG. 24 is a view showing the relationship between another direction of motion of the stirring vane shown in FIG. 22 and an angle of the stirring vane with respect to a surface to be plated of a workpiece;

FIG. 26 is a schematic perspective view of a plating apparatus (electroplating apparatus) according to yet another embodiment of the present invention;

DETAILED DESCRIPTION OF THE INVENTION

Embodiments of the present invention will be described below with reference to the drawings. The following embodiments show examples in which a substrate such as a semiconductor wafer is used as a workpiece to be plated.

Figure 1:
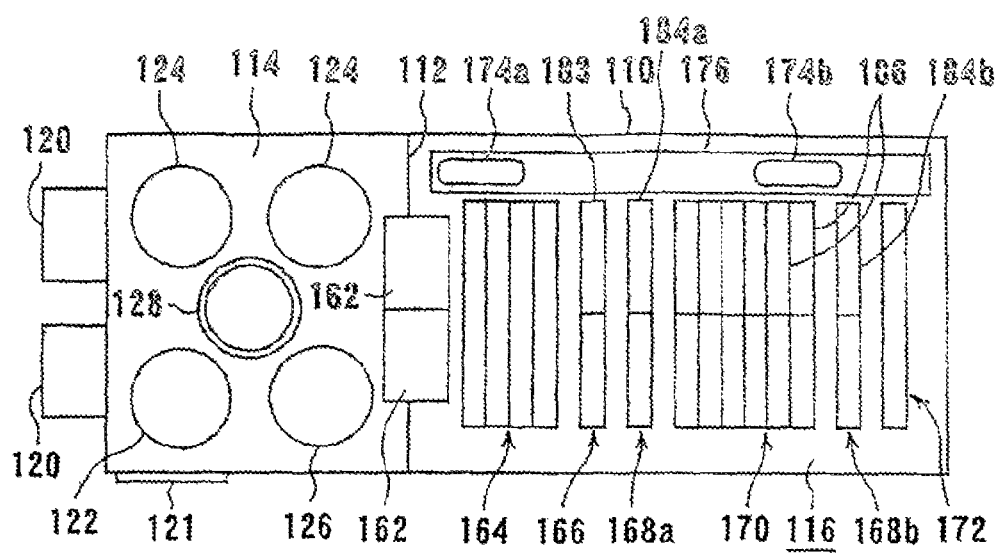
FIG. 1 is a view of the overall layout of a plating facility having a plating apparatus (electroplating apparatus) according to an embodiment of the present invention.

FIG. 1 shows an overall layout of a plating facility having a plating apparatus according to an embodiment of the present invention. The plating facility is designed so as to automatically perform all the plating processes including pretreatment of a substrate, plating, and after treatment of the plating, in a successive manner. The interior of an apparatus frame 110 having an armored panel attached thereto is divided by a partition plate 112 into a plating space 116 for performing a plating process of a substrate and treatments of the substrate to which a plating solution is attached, and a clean space 114 for performing other processes, i.e. processes not directly involving a plating solution. Two substrate holders 160 (see FIG. 2) are arranged in parallel, and substrate attachment/detachment stages 162 to attach a substrate to and detach a substrate from each substrate holder 160 are provided as a substrate delivery section on a partition portion partitioned by the partition plate 112, which divides the plating space 116 from the clean space 114. Loading/unloading ports 120, on which substrate cassettes housing substrates are mounted, are connected to the clean space 114. Further, the apparatus frame 110 has a console panel 121 provided thereon.

In the clean space 114, there are disposed at four corners an aligner 122 for aligning an orientation flat or a notch of a substrate with a predetermined direction, two cleaning/drying devices 124 for cleaning a plated substrate and rotating the substrate at a high speed to spin-dry the substrate, and a pretreatment device 126 for carrying out a pretreatment of a substrate, e.g., according to the present embodiment, a rinsing pretreatment including injecting pure water toward a front face (surface to be plated) of a substrate to thereby clean the substrate surface with pure water and, at the same time, wet the substrate surface with pure water so as to enhance a hydrophilicity of the substrate surface. Further, a first transfer robot 128 is disposed substantially at the center of these processing devices, i.e. the aligner 122, the cleaning/drying devices 124, and the pretreatment device 126, to thereby transfer and deliver a substrate between the processing devices 122, 124, and 126, the substrate attachment/detachment stages 162, and the substrate cassettes mounted on the loading/unloading ports 120.

The aligner 122, the cleaning/drying devices 124, and the pretreatment device 126 disposed in the clean space 114 are designed so as to hold and process a substrate in a horizontal state in which a front face of the substrate faces upward. The transfer robot 128 is designed so as to transfer and deliver a substrate in a horizontal state in which a front face of the substrate faces upward.

In the plating space 116, in the order from the partition plate 112 side, there are disposed a stocker 164 for storing or temporarily storing the substrate holders 160, an activation treatment device 166 for etching, for example, an oxide film, having a large electric resistance, on a seed layer formed on a surface of a substrate with a chemical liquid such as sulfuric acid or hydrochloric acid to remove the oxide film, a first rinsing device 168a for rinsing the surface of the substrate with pure water, a plating apparatus 170 for carrying out plating, a second rinsing device 168b, and a blowing device 172 for dewatering the plated substrate. Two second transfer robots 174a and 174b are disposed beside these devices so as to be movable along a rail 176. One of the second transfer robots 174a transfers the substrate holders 160 between the substrate attachment/detachment stages 162 and the stocker 164. The other of the second transfer robots 174b transfers the substrate holders 160 between the stocker 164, the activation treatment device 166, the first rinsing device 168a, the plating apparatus 170, the second rinsing device 168b, and the blowing device 172.

Figure 2:
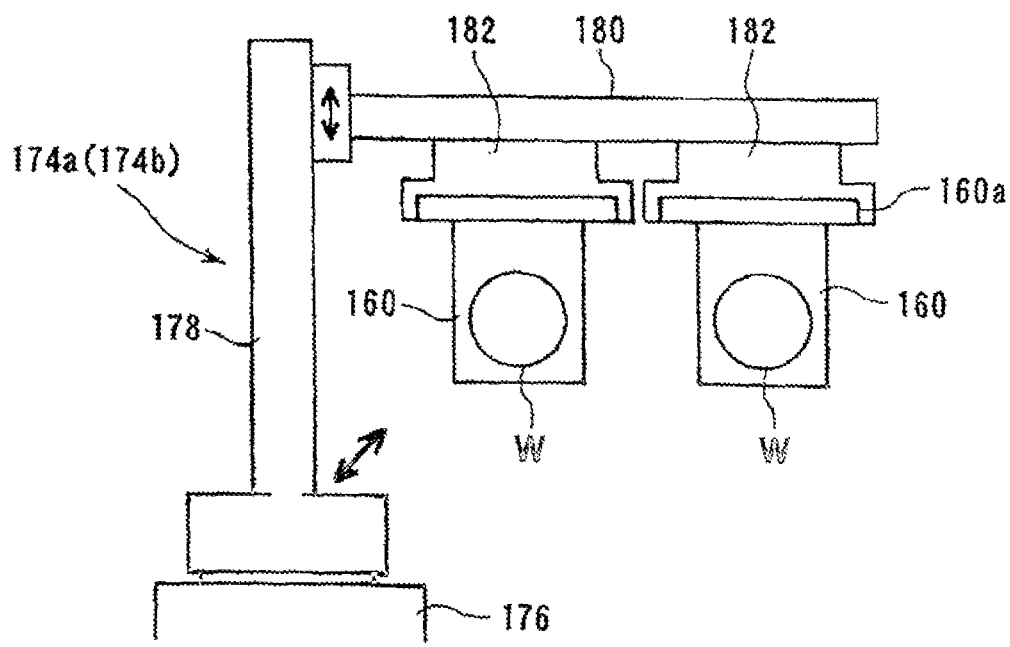
FIG. 2 is a schematic view of a transfer robot disposed in a plating space in the plating facility shown in FIG. 1.

As shown in FIG. 2, each of the second transfer robots 174a and 174b has a body 178 extending in a vertical direction and an arm 180 which is vertically movable along the body 178 and rotatable about its axis. The arm 180 has two substrate holder retaining portions 182 provided in parallel for detachably retaining the substrate holders 160. The substrate holder 160 is designed so as to hold a substrate W in a state such that a front face of the substrate is exposed while a peripheral portion of the substrate is sealed, and to be capable of attaching the substrate W to the substrate holder 160 and detaching the substrate W from the substrate holder 160.

The stocker 164, the activation treatment device 166, the rinsing devices 168a, 168b, and the plating apparatus 170 are designed so as to engage with outwardly projecting portions 160a provided at both ends of each substrate holder 160 to thus support the substrate holders 160 in a state such that the substrate holders 160 are suspended in a vertical direction. The activation treatment device 166 has two activation treatment tanks 183 for holding a chemical liquid therein. As shown in FIG. 2, the arm 180 of the second transfer robot 174b holding the substrate holders 160, which are loaded with the substrates W, in a vertical state is lowered so as to engage the substrate holders 160 with upper ends of the activation treatment tanks 183 to support the substrate holders 160 in a suspended manner as needed. Thus, the activation treatment device 166 is designed so that the substrate holders 160 are immersed together with the substrates W in the chemical liquid in the activation treatment tanks 183 to carry out an activation treatment.

Similarly, the rinsing devices 168a and 168b have two rinsing tanks 184a and two rinsing tanks 184b which hold pure water therein, respectively, and the plating apparatus 170 has a plurality of plating tanks 186 which hold a plating solution therein. The rinsing devices 168a, 168b and the plating apparatus 170 are designed so that the substrate holders 160 are immersed together with the substrates W in the pure water in the rinsing tanks 184a, 184b or the plating solution in the plating tanks 186 to carry out rinsing treatment or plating in the same manner as described above. The arm 180 of the second transfer robot 174b holding the substrate holders 160 with substrates W in a vertical state is lowered, and air or inert gas is injected toward the substrates W mounted on the substrate holders 160 to blow away a liquid attached to the substrate holders 160 and the substrates W and to dewater the substrates W. Thus, the blowing device 172 is designed so as to carry out blowing treatment.

Figure 3:
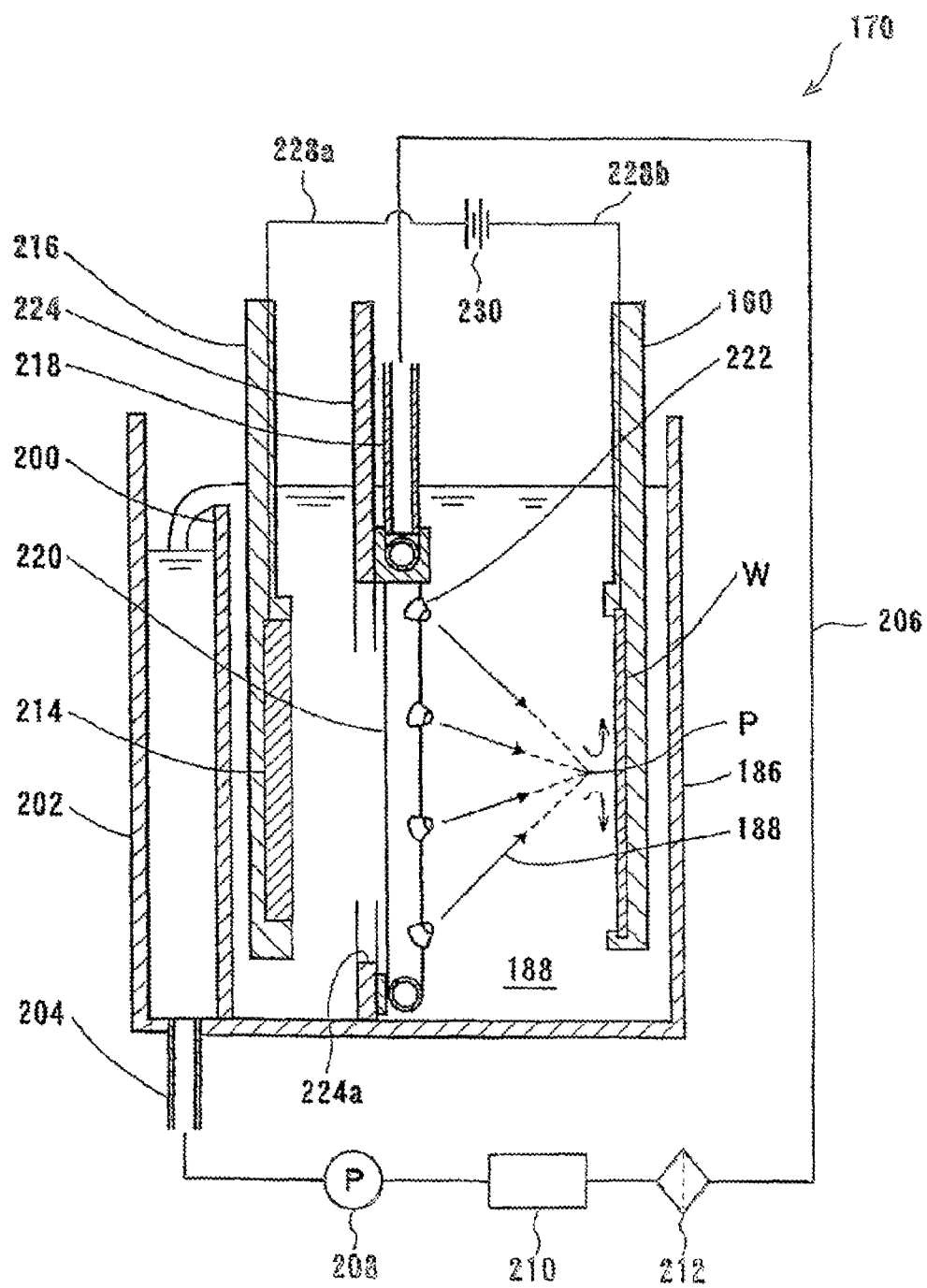
FIG. 3 is a cross-sectional view of the plating apparatus (electroplating apparatus) provided in the plating facility shown in FIG. 1.

As shown in FIG. 3, each plating tank 186 in the plating apparatus 170 is designed so as to hold a plating solution 188 therein. Thus, the substrates W, which are held in a state such that the front faces (surfaces to be plated) are exposed while peripheral portions of the substrates W are water-tightly sealed with the substrate holders 160, are immersed in the plating solution 188.

An overflow tank 202 is provided at a side of the plating tank 186 for receiving a plating solution 188 overflowing upper end of overflow weir 200 of the plating tank 186. A plating solution discharge line 204 is connected to the overflow tank 202. A plating liquid circulation line 208 connecting between the plating solution discharge line 204 and a below-described plating liquid supply line 218 has a circulating pump 208, a flow rate adjusting unit 210, and a filter 212 therein. A plating solution 188 supplied into the plating tank 186 by operation of the circulating pump 208 fills the plating tank 186, then overflows the overflow weir 200, flows into the overflow tank 202, and returns to the circulating pump 208. Thus, the plating solution 188 is circulated and the flow rate of the plating solution flowing along the plating liquid circulation line 208 is adjusted by the flow rate adjusting unit 210.

An anode 214 in the form of a disk shaped like a substrate W is held by an anode holder 216 and vertically disposed in the plating tank 186. When the plating tank 186 is filled with the plating solution 188, the anode 216 is immersed in the plating solution 188 and faces a substrate W held by the substrate holder 160, and placed in a predetermined position in the plating tank 186.

Figure 4:
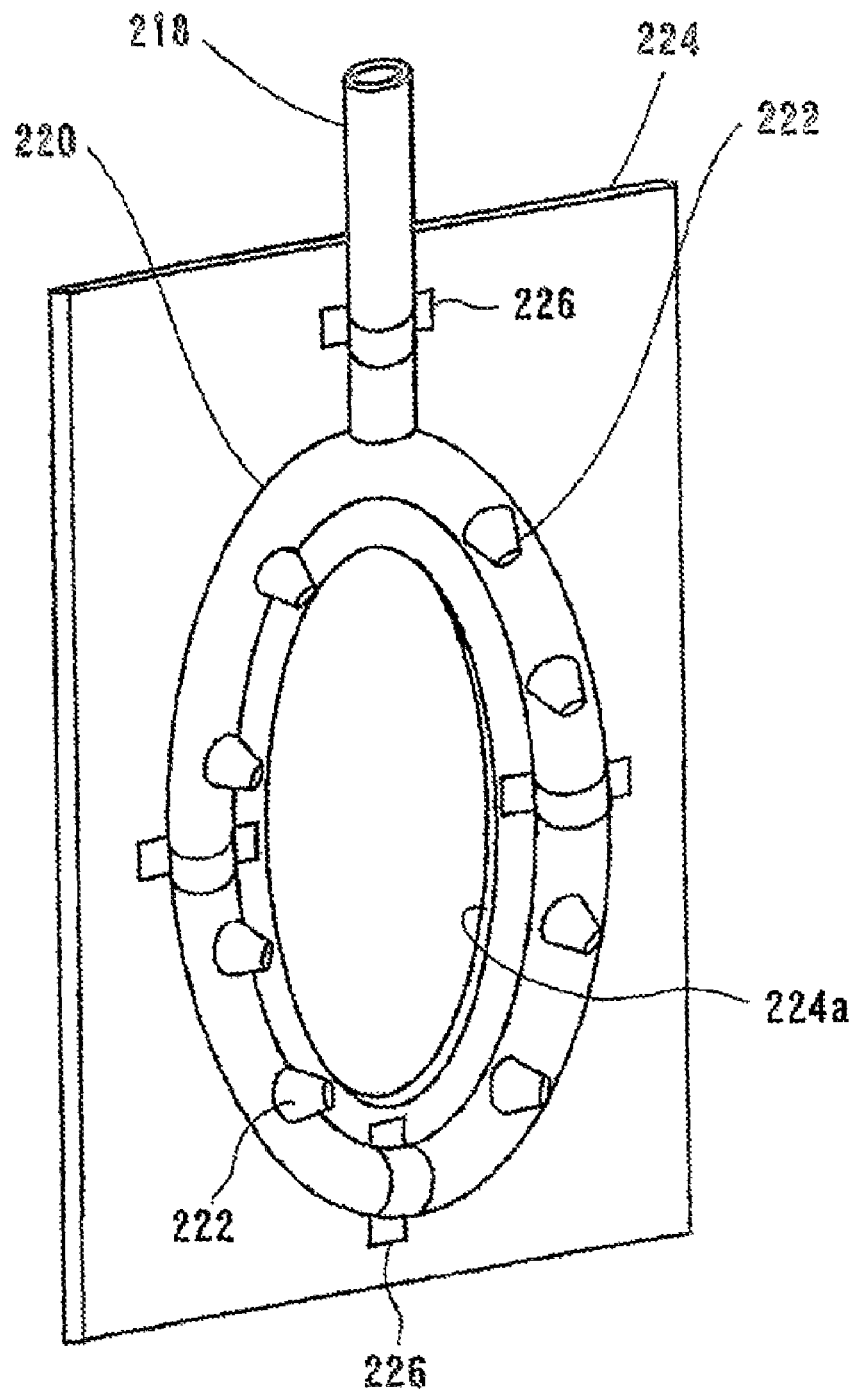
FIG. 4 is a perspective view of a fixing plate and a nozzle pipe of the plating apparatus shown in FIG. 3.

In the plating tank 186, there is also disposed a ring-shaped nozzle pipe 220 positioned between the anode 214 and the substrate holder 160 that is placed at the predetermined position in the plating tank 186. The nozzle pipe 220 is connected to a plating solution supply line 218. As shown in FIG. 4, the nozzle pipe 220 is shaped as a circular ring along the outer profile of the substrate W, and has a plurality of plating solution injection nozzles 222 located at a predetermined pitch in respective predetermined positions spaced in the circumferential direction of the nozzle pipe 220. The plating solution 188, which is circulated by operation of the circulation pump 208, as described above, is injected from the plating solution injection nozzles 222 and supplied into the plating tank 186.

In this embodiment, the nozzle pipe 220 is fixedly fasteners 226 to a rectangular fixing plate 224 which has an opening 224a defined therein and divides the interior of the plating tank 186 into a compartment for housing the anode 214 therein and a compartment for housing the substrate W therein. The opening 224a has a size which is substantially the same as, or slightly smaller than, the inside diameter of the nozzle pipe 220. The nozzle pipe 220 is positioned on the substrate side of the fixing plate 224 and disposed in surrounding relation to the surrounding edge of the opening 224a. The plating solution injection nozzles 222 are oriented such that the streams of the plating solution 188 injected from the plating solution injection nozzles 222 join each other at a joint point P which is in front of a substantially central area of the substrate W held by the substrate holder 160, and disposed in the predetermined position in the plating tank 186.

The plating solution injection nozzles 222 formed on the ring-shaped nozzle pipe 220 inject the plating solution 188 to supply the plating solution 188 into the plating tank 186 and circulate the plating solution 188. At this time, the plating solution 188 injected from the plating solution injection nozzles 222 is applied as strong streams to the surface (surface to be plated) of the substrate W, thereby efficiently supplying ions in the plating solution 188 to the surface of the substrate W while preventing the uniformity of the potential distribution on the entire surface of the substrate W from being disturbed. The plating speed is thus increased without degrading the quality of the plated film. In addition, the uniformity of the film thickness of the plated film formed on the surface of the substrate W can be increased by adjusting the flow rate and direction of the plating solution 188 injected from the plating solution injection nozzles 222 in order to provide a more uniform flow of the plating solution 188 near the surface of the substrate W.

In particular, since the streams of the plating solution 188 injected from the plating solution injection nozzles 222 join each other at the joint point P which is in front of the substantially central area of the surface of the substrate W, the flow of the plating solution 188 is applied perpendicularly to the substantially central area of the surface of the substrate W. Thereafter, the flow of the plating solution 188 changes its direction to spread outwardly along the surface of the substrate W. Therefore, the flow of the plating solution 188 after it has impinged upon the surface of the substrate W is prevented from interfering with the discharged flow of the plating solution 188, and hence is formed as a constant continuous and stable flow.

The nozzle pipe 220, the plating solution injection nozzles 222 and the fixing plate 224 should preferably be made of a dielectric material such as PVC, PP, PEEK, PES, HT-PVC, PFA, PTFE, or other resin materials. These dielectric materials are effective to prevent the electric field distribution in the plating tank 186 from being disturbed.

The interior of the plating tank 186 is divided with the fixing plate 224 having the opening 224a. The plating solution 188 passes through the opening 224a and thereafter flows into the overflow tank 202. Consequently, the potential distribution over the entire area of the substrate W is made more uniform.

The plating apparatus 170 operates as follows: First, the plating tank 186 is filled with the plating solution 188. Then, the substrate holder 160 which is holding the substrate W is lowered to place the substrate W in a predetermined position where the substrate W is immersed in the plating solution 188 in the plating tank 186. Then, the circulation pump 208 is operated to inject the plating solution 188 from the plating solution injection nozzles 222 toward the surface of the substrate W, thus supplying the plating solution 188 into the plating tank 186 and circulating the plating solution 188. At the same time, the anode 214 is connected via a conductor 228a to an anode of a plating power supply 230, and the substrate W is connected via a conductor 228b to a cathode of the plating power supply 230, thus precipitating metal on the surface of the substrate W to form a metal film thereon.

At this time, the plating solution 188 injected from the plating solution injection nozzles 222 is applied as strong streams to the surface (to be plated) of the substrate W, so that the plating speed can be increased without degrading the quality of the plated film. In addition, the uniformity of the film thickness of the plated film formed on the surface of the substrate W can be increased by making adjustments to provide a more uniform flow of the plating solution 188 near the surface of the substrate W.

After the plating process is finished, the plating power supply 230 is disconnected from the substrate W and the anode 214, and the substrate holder 160 together with the substrate W is pulled upward. The substrate W is then processed, e.g., cleaned with water and rinsed, after which the plated substrate W is delivered to a next process.

Figure 5A:
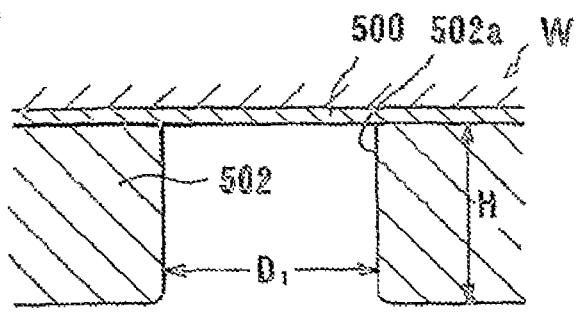
FIGS. 5A through 5E are cross-sectional diagrams sequentially illustrating a process of forming a bump (protruding electrode) on a substrate.

A series of bump plating processes in the plating facility thus constructed will be described below with reference to FIGS. 5A through 5E. First, as shown in FIG. 5A, a seed layer 500 is deposited as a feeding layer on a surface of a substrate W, and a resist 502 having a height H of, for example, about 20 to 120 μm is applied onto the entire surface of the seed layer 500. Thereafter, an opening 502a having a diameter $D_1$ of, for example, about 20 to 200 μm is formed at a predetermined position of the resist 502. Substrates W thus prepared are housed in a substrate cassette in a state such that front faces (surfaces to be plated) of the substrates face upward. The substrate cassette is mounted on the loading/unloading port 120.

One of the substrates W is taken out of the substrate cassette mounted on the loading/unloading port 120 by the first transfer robot 128 and placed on the aligner 122 to align an orientation flat or a notch of the substrate with a predetermined direction. The substrate W thus aligned is transferred to the pretreatment device 126 by the first transfer robot 128. In the pretreatment device 126, a pretreatment (rinsing pretreatment) using pure water as a pretreatment liquid is carried out. On the other hand, two substrate holders 160 which have been stored in a vertical state in the stocker 164 are taken out by the second transfer robot 174a, rotated through 90° so that the substrate holders 160 are brought into a horizontal state, and then placed in parallel on the substrate attachment/detachment stages 162.

Then, the substrates W which have been subjected to the aforementioned pretreatment (rinsing pretreatment) are loaded into the substrate holders 160 placed on the substrate attachment/detachment stages 162 in a state such that peripheral portions of the substrates W are sealed. The two substrate holders 160 which have been loaded with the substrates W are simultaneously retained, lifted, and then transferred to the stocker 164 by the second transfer robot 174a. The substrate holders 160 are rotated through 90° into a vertical state and lowered so that the two substrate holders 160 are held (temporarily stored) in the stocker 164 in a suspended manner. The above operation is carried out repeatedly in a sequential manner, so that substrates are sequentially loaded into the substrate holders 160, which are stored in the stocker 164, and are sequentially held (temporarily stored) in the stocker 164 at predetermined positions in a suspended manner.

On the other hand, the two substrate holders 160 which have been loaded with the substrates and temporarily stored in the stocker 164 are simultaneously lifted, and then transferred to the activation treatment device 166 by the second transfer robot 174b. Each substrate is immersed in a chemical liquid such as sulfuric acid or hydrochloric acid held in the activation treatment tank 183 to thereby etch an oxide film, having a large electric resistance, formed on the surface of the seed layer so as to expose a clean metal surface. The substrate holders 160 which have been loaded with the substrates are transferred to the first rinsing device 168a in the same manner as described above to rinse the surfaces of the substrates with pure water held in the rinsing tanks 184a.

The substrate holders 160 which have been loaded with the rinsed substrates are transferred to the plating apparatus 170 in the same manner as described above. Each substrate W is supported in a suspended manner by the plating tank 186 in a state such that the substrate W is immersed in the plating solution 188 held in the plating tank 186 to thus carry out plating on the surface of the substrate W. After a predetermined period of time has elapsed, the substrate holders 160 which have been loaded with the substrates are pulled up from the plating tank 186 by the second transfer robot 174b. Thus, the plating process is completed.

Thereafter, the substrate holders 160 are transferred to the second rinsing device 168b in the same manner as described above. The substrate holders 160 are immersed in pure water in the rinsing tanks 184b to clean the surfaces of the substrates with pure water. Then, the substrate holders 160 which have been loaded with the substrates are transferred to the blowing device 172 in the same manner as described above. In the blowing device 172, inert gas or air is injected toward the substrates to blow away a plating solution and water droplets attached to the substrates and the substrate holders 160. Thereafter, the substrate holders 160 which have been loaded with the substrates are returned to predetermined positions in the stocker 164 and held in a suspended state in the same manner as described above.

The second transfer robot 174b sequentially performs the above operation repeatedly so that the substrate holders 160 which have been loaded with the plated substrates are sequentially returned to predetermined positions in the stocker 164 and held in a suspended manner.

On the other hand, the two substrate holders 160 which have been loaded with the plated substrates are simultaneously placed on the substrate attachment/detachment stages 162 by the second transfer robot 174a in the same manner as described above.

Figure 5B:
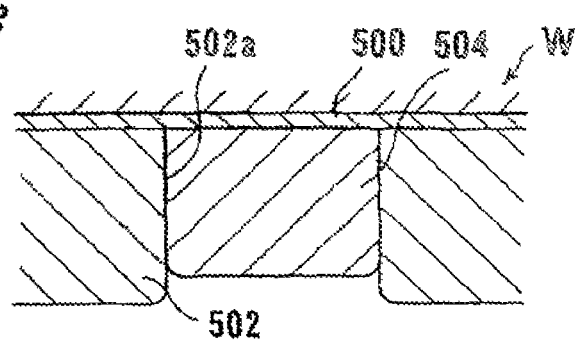

The first transfer robot 128 disposed in the clean space 114 takes the substrate out of the substrate holders 160 placed on the substrate attachment/detachment stages 162 and transfers the substrate to either one of the cleaning/drying devices 124. In the cleaning/drying device 124, the substrate held in a horizontal state such that the front face of the substrate faces upward is cleaned with pure water or the like and rotated at a high speed to spin-dry the substrate. Thereafter, the substrate is then returned to the substrate cassette mounted on the loading/unloading port 120 by the first transfer robot 128. Thus, a series of plating processes is completed. As a result, as shown in FIG. 5B, a substrate W having a plated film 504 grown in the opening 502a formed in the resist 502 can be obtained.

Figure 5C:
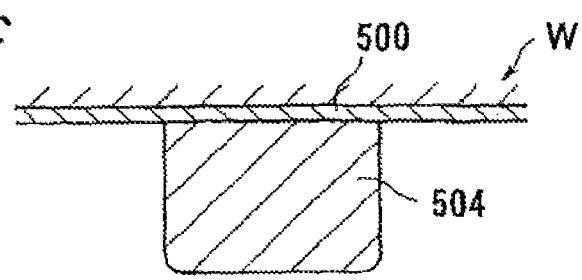
Figure 5D:
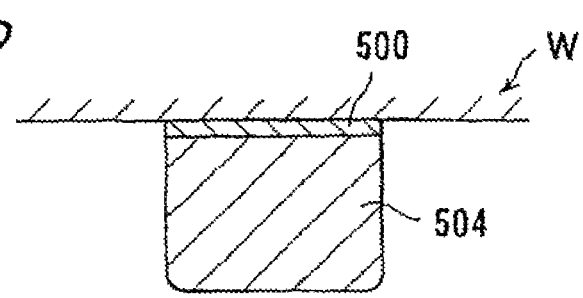
Figure 5E:
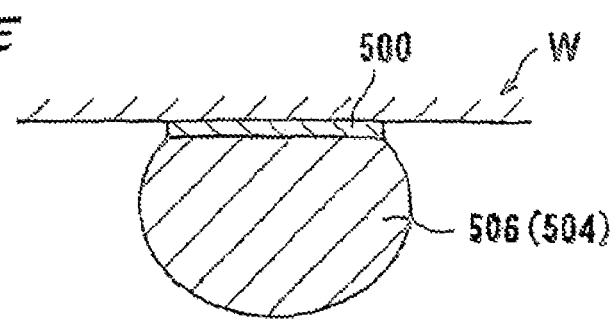

The spin-dried substrate W, as described above, is immersed in a solvent such as acetone at a temperature of, for example, 50 to 60° C. to remove the resist 502 from the substrate W as shown in FIG. 5C. Further, as shown in FIG. 5D, an unnecessary seed layer 502, which is exposed after plating, is removed. Next, the plated film 504 formed on the substrate W is reflowed to form a bump 506 having a round shape due to surface tension as shown in FIG. 5E. The substrate W is then annealed at a temperature of, for example, 100° C. or more to remove residual stress in the bump 506.

According to this embodiment, delivery of substrates in the plating space 116 is performed by the second transfer robots 174a, 174b disposed in the plating space 116, whereas delivery of substrates in the clean space 114 is performed by the first transfer robot 128 disposed in the clean space 114. Accordingly, it is possible to improve the cleanliness around a substrate in the plating facility which performs all the plating processes including pretreatment of a substrate, plating, and after treatment of the plating, in a successive manner, and to increase a throughput of the plating facility. Further, it is possible to reduce loads on facilities associated with the plating facility and to achieve downsizing of the plating facility.

In the present embodiment, the plating apparatus 170 for performing the plating process has the plating tank 186 which is of a small footprint. Therefore, a plating apparatus 170 having a number of plating tanks 186 may be small in size, making smaller facility loads ancillary to a plating plant. In FIG. 1, one of two cleaning/drying devices 124 may be replaced with a pretreatment device.

Figure 6:
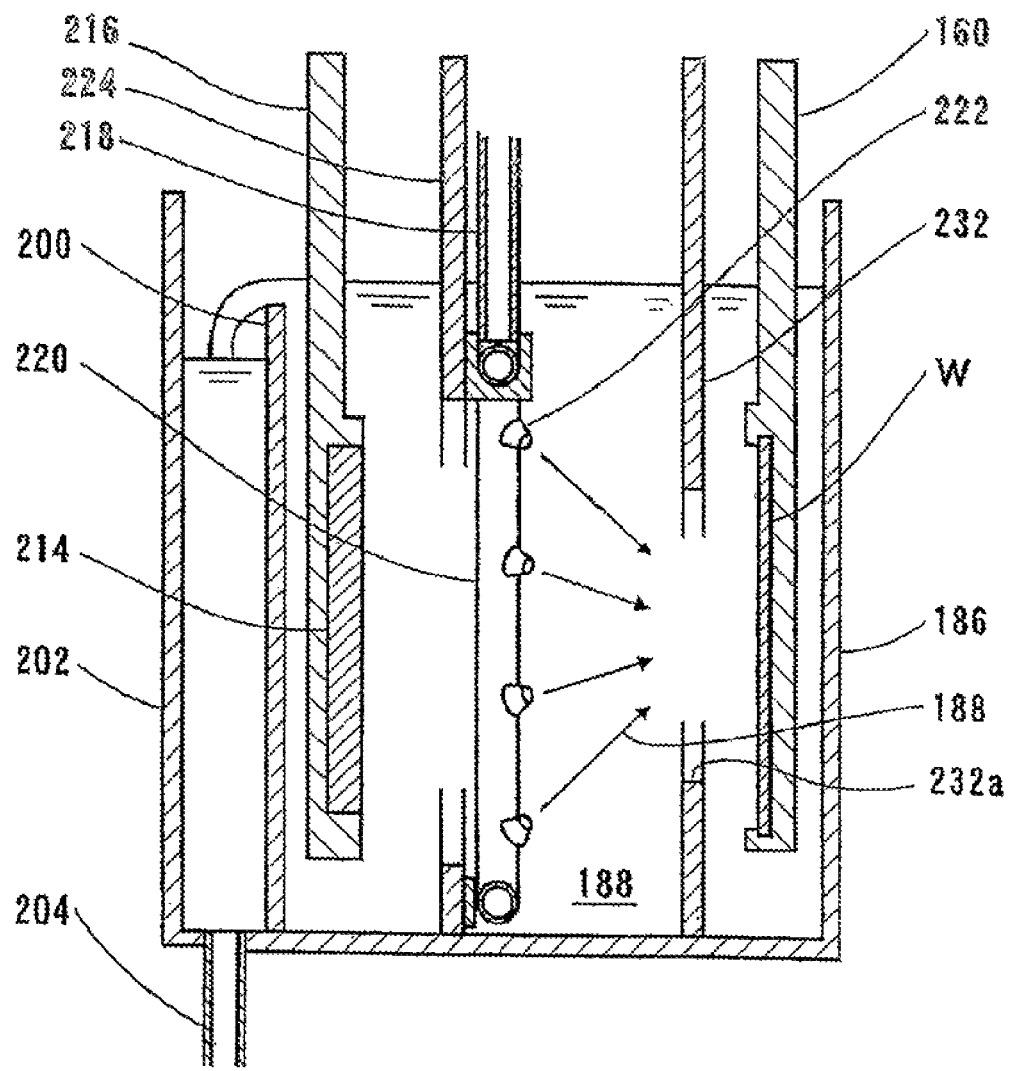
FIG. 6 is a schematic cross-sectional view of a plating apparatus (electroplating apparatus) according to another embodiment of the present invention.

FIG. 6 shows a plating apparatus (electroplating apparatus) according to another embodiment of the present invention. The plating apparatus shown in FIG. 6 is different from the plating apparatus shown in FIGS. 3 and 4 in that a regulation plate 232 having a central hole 232a and a thickness ranging from 0.5 to 10 mm and made of a dielectric material such as PVC, PP, PEEK, PES, HT-PVC, PFFA, PTFE, or other resin materials is disposed between the substrate holder 160 which holds the substrate W and is disposed in a predetermined position in the plating tank 186 and the nozzle pipe 220 which has the plating solution injection nozzles 222. Other structural details of the plating apparatus shown in FIG. 6 are identical to those of the plating apparatus shown in FIGS. 3 and 4.

In the present embodiment, the regulation plate 232 having the central hole 232a regulates the potential distribution in the plating tank 186 to prevent the plating film grown on the peripheral edge of the substrate W from increasing in thickness.

Figure 7:
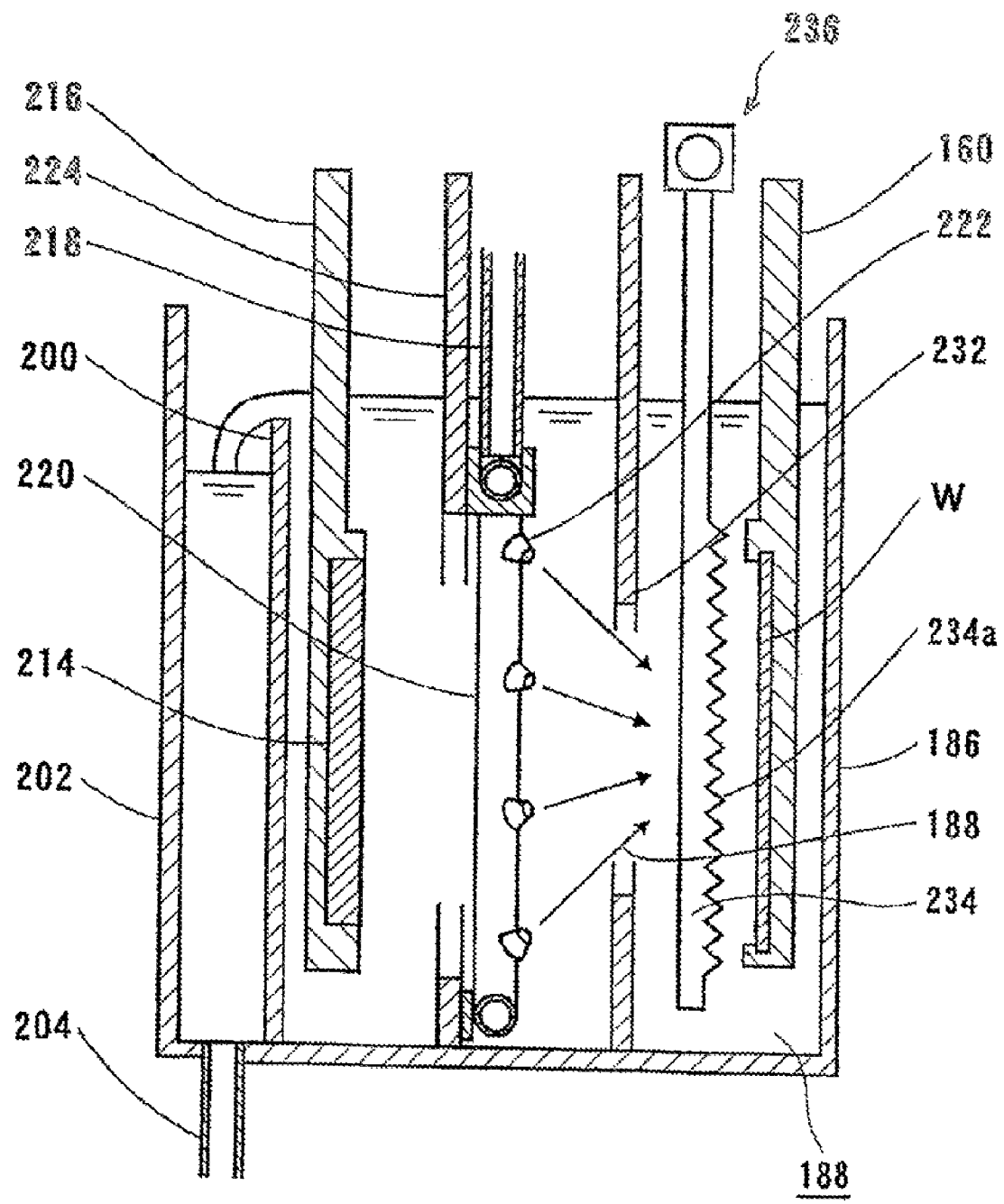
FIG. 7 is a schematic cross-sectional view of a plating apparatus (electroplating apparatus) according to still another embodiment of the present invention.

FIG. 7 shows a plating apparatus (electroplating apparatus) according to still another embodiment of the present invention. The plating apparatus shown in FIG. 7 is different from the plating apparatus shown in FIG. 6 in that a stirring mechanism 236 having a stirring vane (paddle) 234 is disposed between the substrate holder 160 which holds the substrate W and is disposed in a predetermined position in the plating tank 186 and the regulation plate 232. The stirring mechanism 236 reciprocally moves the stirring vane 234 parallel to the substrate W held by the substrate holder 160 for thereby stirring the plating solution 188.

In the present embodiment, the stirring vane 234 is reciprocally moved parallel to the substrate W in the plating solution 188 by the stirring mechanism 236 to stir the plating solution 188 that is present between the regulation plate 232 and the substrate W, thereby making more uniform the flow of the plating solution 188 along the surface of the substrate W over the entire surface of the substrate W to form a plated film of more uniform film thickness over the entire surface of the substrate W.

In the present embodiment, the stirring vane 234 has irregularities 234a on its side facing the substrate W. The stirring vane 234 with the irregularities 234a on its side facing the substrate W is capable of generating many swirls uniformly and generally in the plating solution 188 when the stirring vane 234 is reciprocally moved, as with a below-described embodiment. Thus, the flow of the plating solution 188 that is in contact with the surface (to be plated) of the substrate W is more uniformly and effectively applied to form a plated film having better film thickness uniformity, i.e., a plated film having a more uniform film thickness, on the surface of the substrate W.

Figure 8:
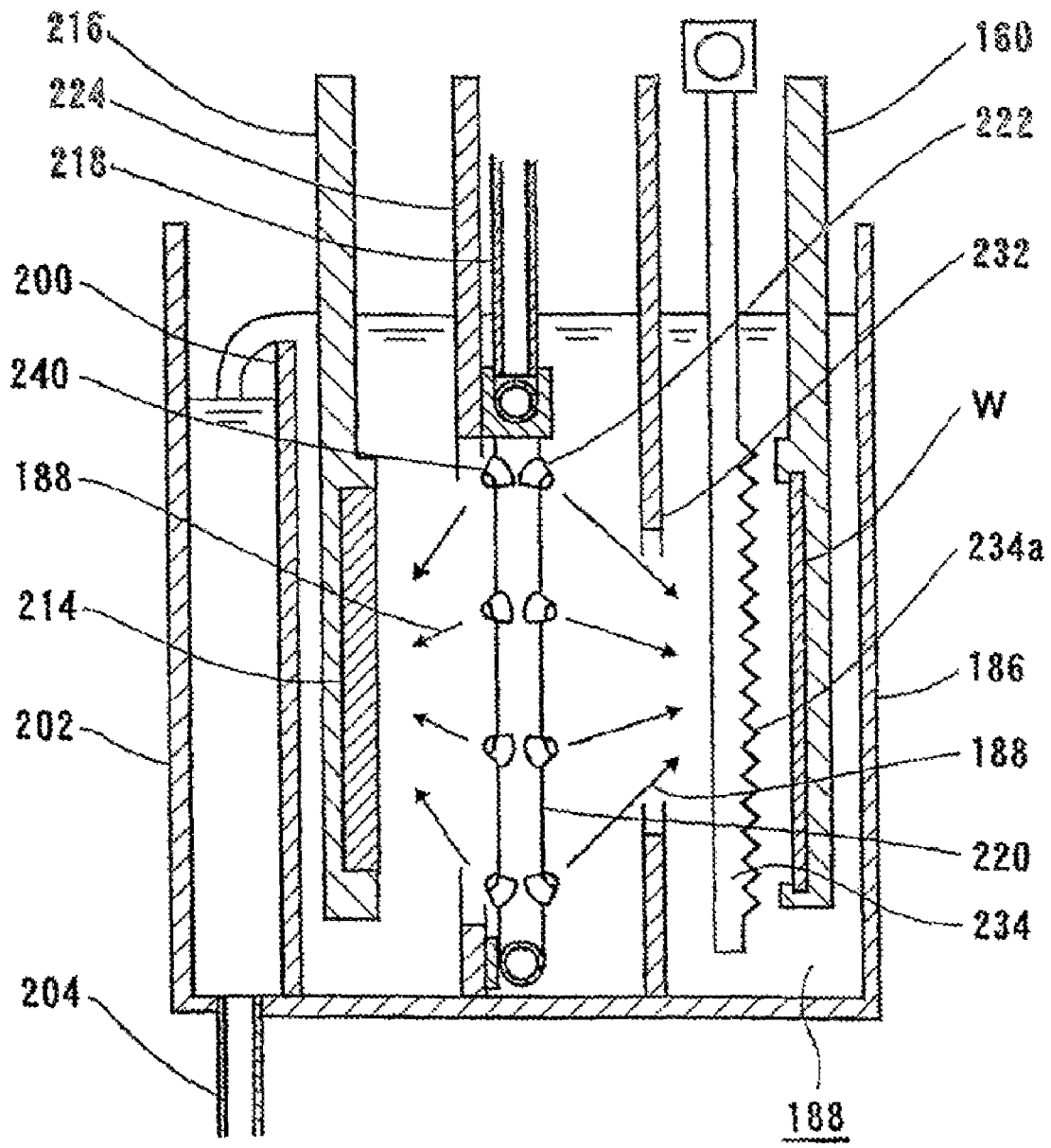
FIG. 8 is a schematic cross-sectional view of a plating apparatus (electroplating apparatus) according to yet another embodiment of the present invention.

FIG. 8 shows a plating apparatus (electroplating apparatus) according to yet another embodiment of the present invention. The plating apparatus shown in FIG. 8 is different from the plating apparatus shown in FIG. 7 in that the nozzle pipe 220 also has a plurality of plating solution injection nozzles 240 on its side facing the anode 214 for injecting the plating solution 188 toward the anode 214, thereby applying streams of plating solution 188 injected from the plating solution injection nozzles 240 to the anode 214. Since the injected streams of plating solution 188 are also applied to the anode 214, the rate at which the anode 214 is dissolved is increased to make it possible to dissolve the anode 214 at a rate commensurate with an increase in the electroplating speed.

Figure 9:
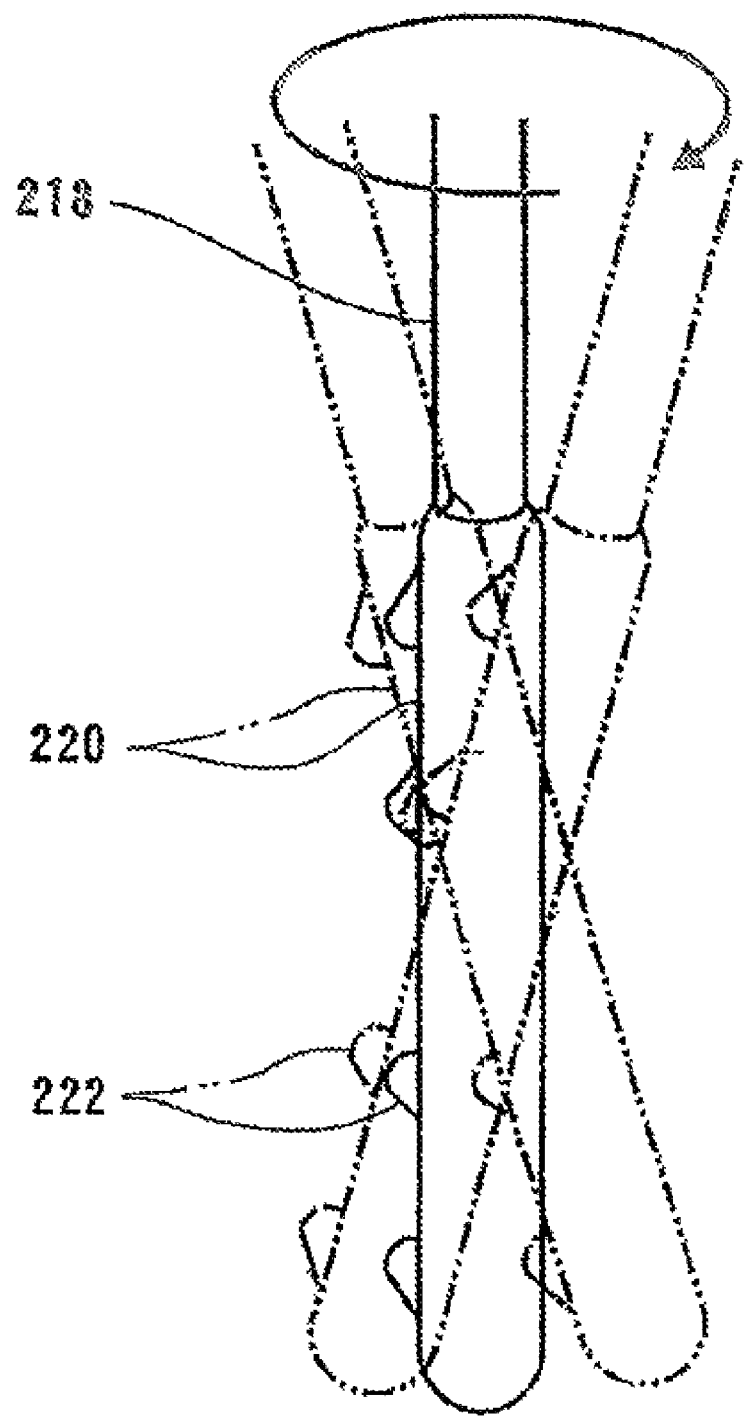
FIG. 9 is a view showing an example of motion (swiveling motion) of a nozzle pipe.

In the above embodiments, the nozzle pipe 220 is fixedly mounted in the plating tank 186 by the fixing plate 224. However, the nozzle pipe may be moved in forward and backward directions, leftward and rightward directions, or upward and downward directions, or in a combination of these directions, with respect to the substrate W held by the substrate holder 160. The nozzle pipe may be moved in a circular pattern in a plane parallel to the surface of the substrate, or as shown in FIG. 9, the nozzle pipe 220 may make a swiveling motion. This makes it possible to further increase the uniformity of the film thickness of the plated film. The same is true for each of embodiments to be described below.

Figure 10:
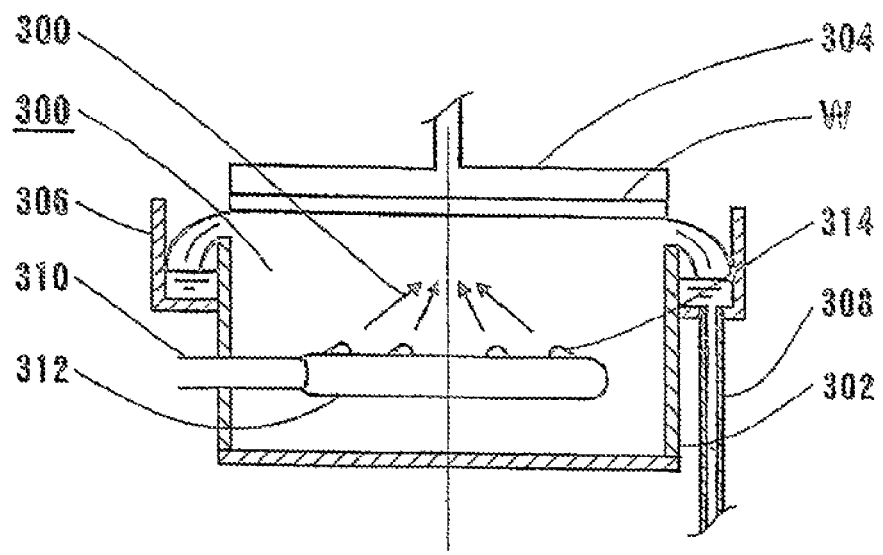
FIG. 10 is a schematic cross-sectional view of a plating apparatus (electroless plating apparatus) according to yet another embodiment of the present invention.
Figure 11:
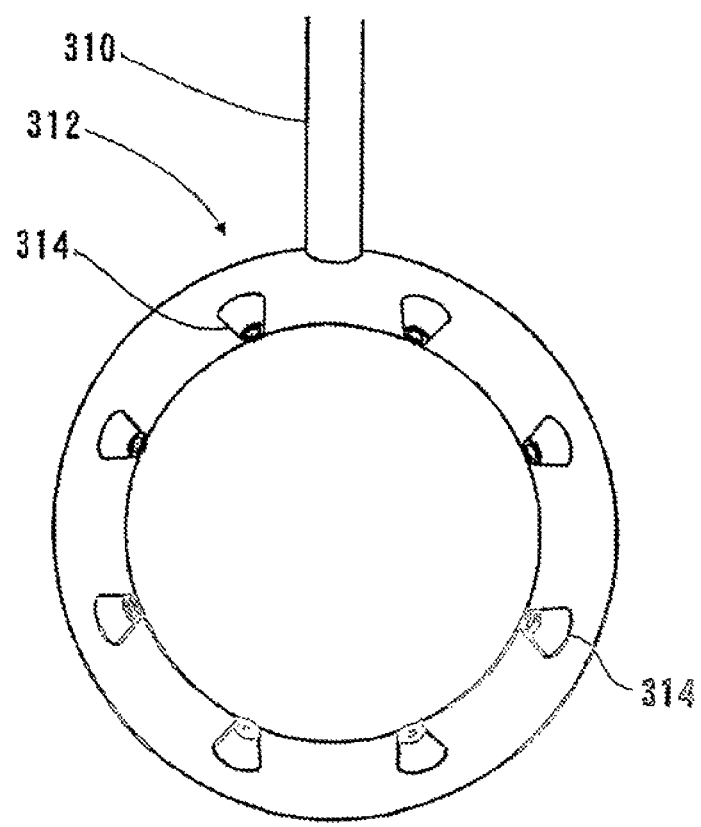
FIG. 11 is a plan view of a nozzle pipe of the plating apparatus shown in FIG. 10.
Figure 12:
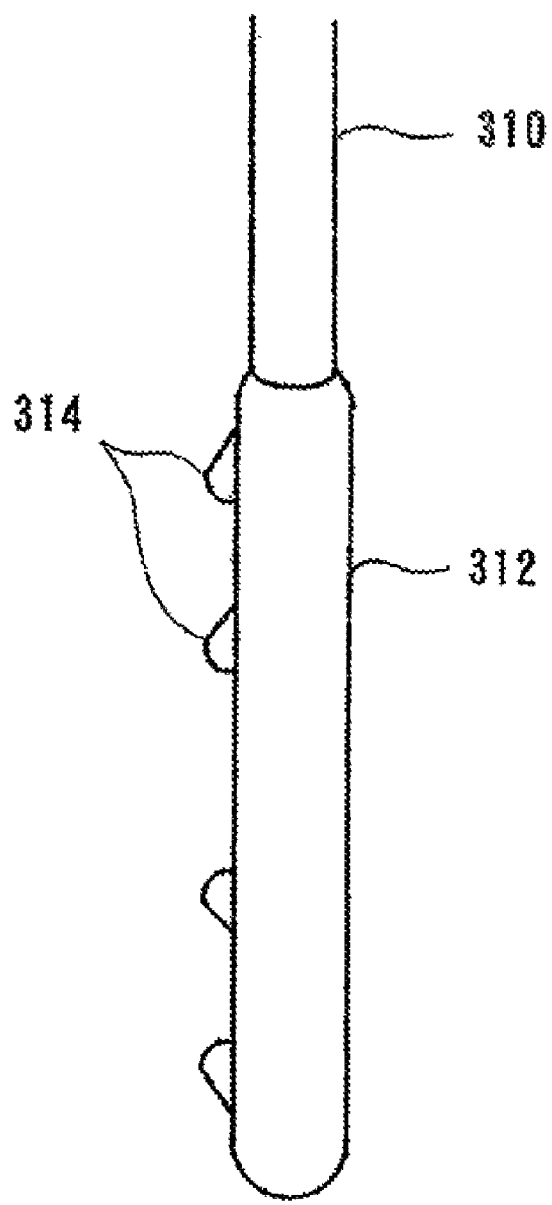
FIG. 12 is a right-hand side view of the nozzle pipe shown in FIG. 11.

FIGS. 10 through 12 show a plating apparatus according to yet still another embodiment of the present invention. According to the present embodiment, the principles of the invention are applied to an electroless plating apparatus for performing electroless plating on a surface (surface to be plated) of the substrate W which is held with the surface facing downward.

The electroless plating apparatus has an upwardly opened plating tank 302 for holding a plating solution (electroless plating solution) 300 therein, and a vertically movable substrate holder 304 for detachably holding the substrate W horizontally with the surface (surface to be plated) thereof facing downward. An overflow tank 306 is disposed around an upper portion of the plating tank 302, and connected to a plating solution discharge line 308. A nozzle pipe 312 connected to a plating solution supply line 310 is horizontally disposed in a position in the plating tank 302 where the nozzle pipe 312 is immersed in the plating solution 300 held in the plating tank 302. The nozzle pipe 312 has a plurality of plating solution injection nozzles 314 located at a predetermined pitch in respective predetermined positions spaced in the circumferential direction of the nozzle pipe 312. The plating solution discharge line 308 and the plating solution supply line 310 are connected to each other with a plating solution circulation line, as with the embodiments described above.

The plating solution injection nozzles 314 are oriented such that they inject the plating solution 300 upwardly and inwardly (toward the center), and the streams of the plating solution 300 injected from the plating solution injection nozzles 314 join each other in front of a substantially central area of the lower surface of the substrate W.

In the present embodiment, the plating solution 300 is injected from the plating solution injection nozzles 314 toward the substrate W that is held by the substrate holder 304, disposed in a position to close the opening at the upper end of the plating tank 302, and rotated, if necessary, and is supplied into the plating tank 302 and circulated for performing electroless plating. In the present embodiment, the plating solution 300 injected from the plating solution injection nozzles 314 is applied as strong streams to the surface (to be plated) of the substrate W, thereby increasing the plating speed without degrading the quality of the plated film. In addition, the uniformity of the film thickness of the plated film formed on the surface of the substrate W can be increased by making adjustments to provide a more uniform flow of the plating solution 300 near the surface of the substrate W.

Figure 13:
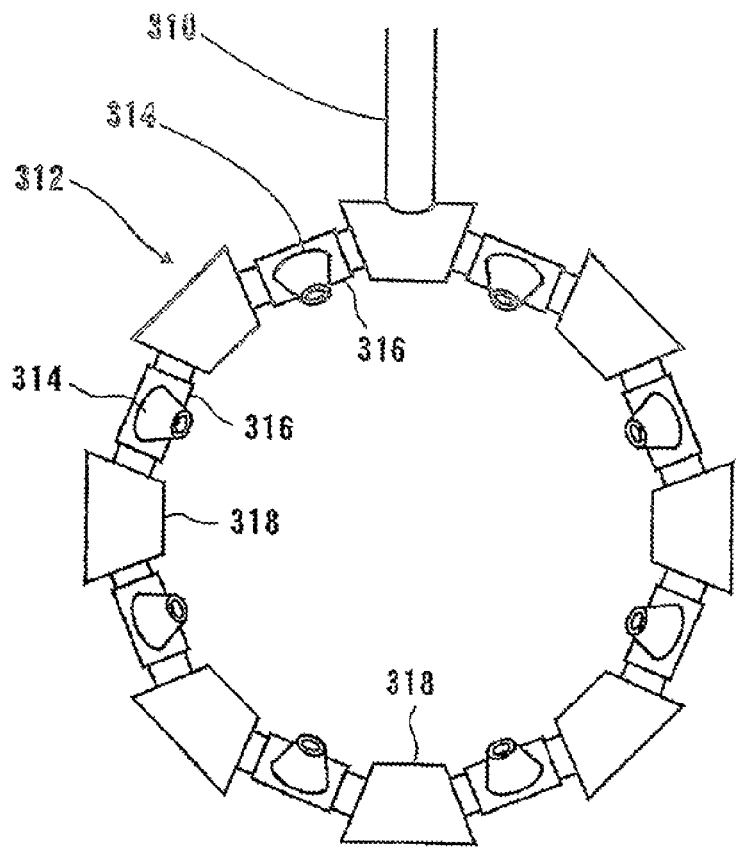
FIG. 13 is a plan view of a modification of the nozzle pipe.

As shown in FIG. 13, segments 316 having respective plating solution injection nozzles 314 may be interconnected by joints 318 in a ring-shaped pattern, thus providing a nozzle pipe 312. With this arrangement, the nozzle pipe 312 can be fabricated conveniently. The same is true for the above embodiments and embodiments to be described below.

Figure 14:
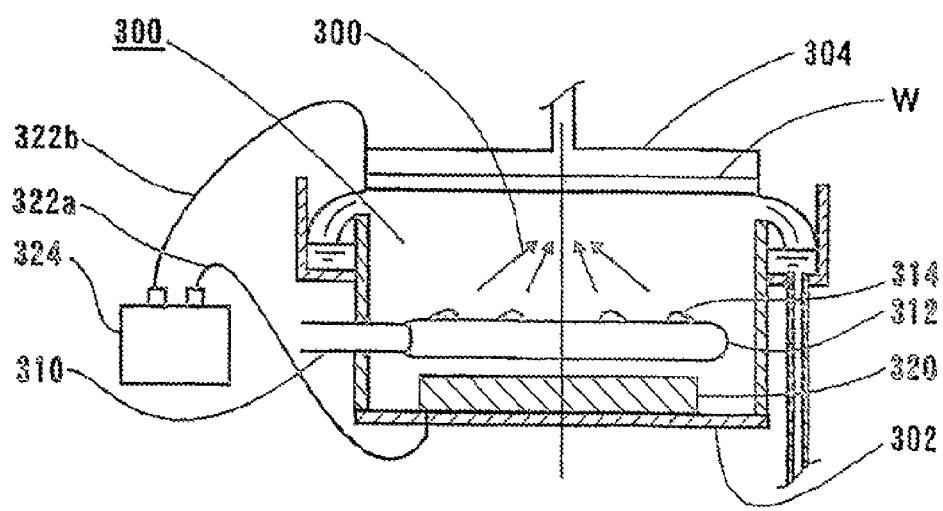
FIG. 14 is a schematic cross-sectional view of a plating apparatus (electroplating apparatus) according to yet another embodiment of the present invention.

FIG. 14 shows a plating apparatus according to yet another embodiment of the present invention. According to the present embodiment, the principles of the invention are applied to an electroplating apparatus for performing electroplating on a surface (surface to be plated) of the substrate W which is held with the surface facing downward. The plating apparatus shown in FIG. 14 is different from the plating apparatus shown in FIGS. 10 through 12 in that an electroplating solution is used as the plating solution 300 and an anode 320 in the form of a flat plate is placed on the bottom of the plating tank 302 below the nozzle pipe 312. The plating solution injection nozzles 314 inject the plating solution 300 toward the surface of the substrate W to supply the plating solution 300 into the plating tank 302 and circulate the plating solution 300. At the same time, the anode 320 is connected via a conductor 322a to an anode of a plating power supply 324, and the substrate W is connected via a conductor 322b to a cathode of the plating power supply 324, thus performing a plating (electroplating) process.

Figure 15:
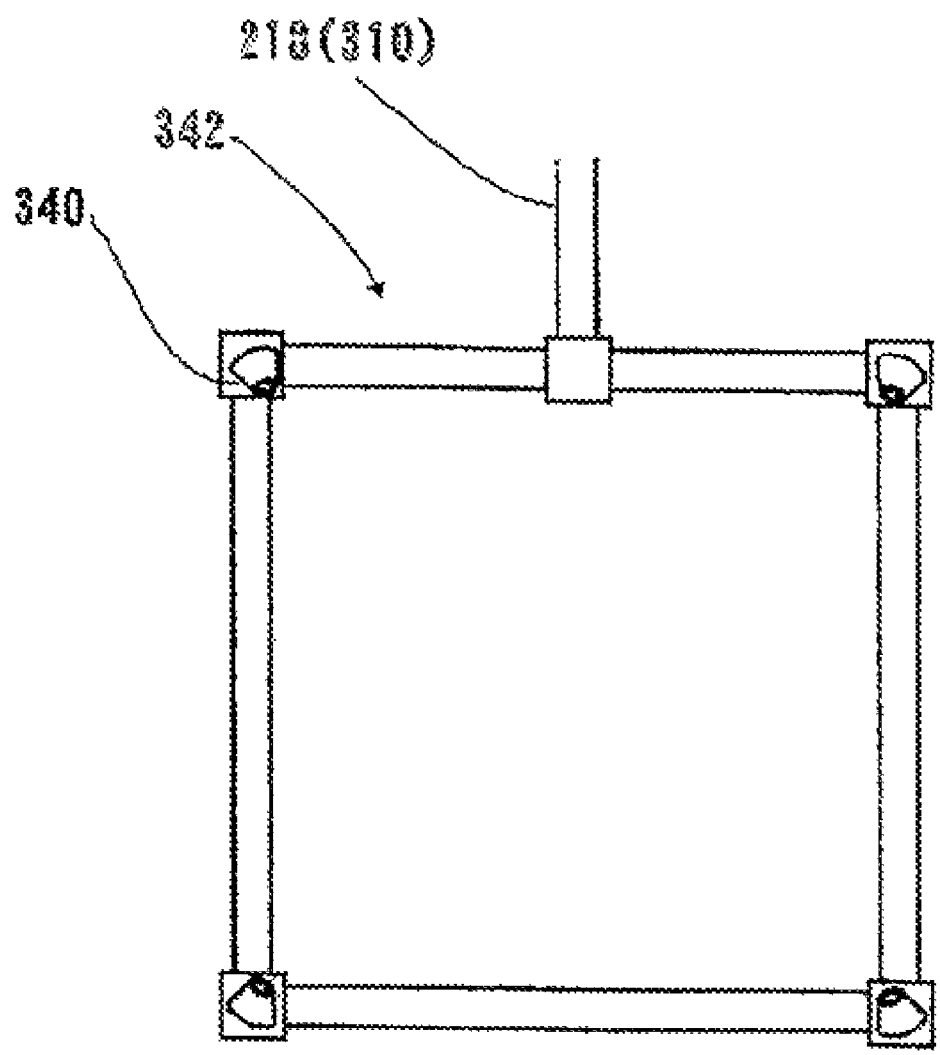
FIG. 15 is a plan view of another modification of the nozzle pipe.

In the above embodiments, the substrate W as a workpiece to be plated is of a circular shape, and the nozzle pipes 220, 312 are of a circular ring shape extending along the outer profile of the substrate W. If a rectangular substrate or the like is employed as a workpiece to be plated, then, as shown in FIG. 15, a nozzle pipe 342 having a rectangular ring shape with plating solution injection nozzles 340 disposed on respective four corners thereof and oriented in a predetermined direction may be employed. The nozzle pipe 342 is capable of forming a more uniform plating solution flow over the entire surface of the rectangular substrate.

According to the present invention, as described above, ions in the plating solution can efficiently be supplied to the surface (to be plated) of the substrate while preventing the uniformity of the potential distribution on the surface of the substrate from being disturbed, so that the plating speed can be increased without degrading the quality of the plated film. In addition, the uniformity of the film thickness of the plated film can be increased by adjusting the flow rate and direction of the plating solution injected from the plating solution injection nozzles in order to provide a more uniform flow of the plating solution near the surface to be plated.

Figure 16:
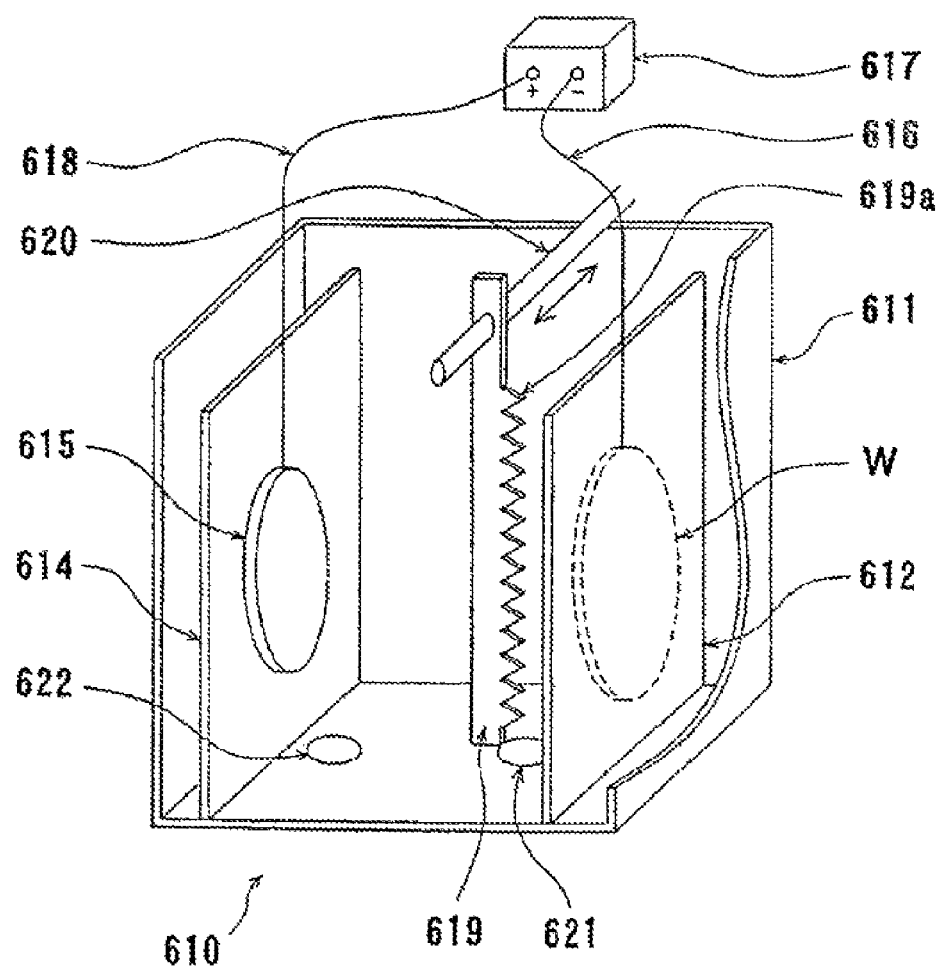
FIG. 16 is a schematic perspective view of a plating apparatus (electroplating apparatus) according to yet another embodiment of the present invention.

FIG. 16 shows a plating apparatus (electroplating apparatus) according to yet another embodiment of the present invention. As shown in FIG. 16, a plating apparatus 610 has a plating tank 611 holding therein a plating solution in which a substrate W held by a substrate holder 612 and an anode 615 held by an anode holder 614 are vertically disposed parallel to each other in confronting relation to each other. The substrate W is connected via a conductor 616 to a cathode of a plating power supply 617, and the anode 615 is connected via a conductor 618 to an anode of the plating power supply 617.

A stirring mechanism 620 having a stirring vane 619 for stirring the plating solution is disposed between the substrate W and the anode 615. The stirring vane 619 extends substantially vertically from the upper portion toward the bottom of the plating tank 611. The stirring mechanism 620 reciprocally moves the stirring vane 619 in directions parallel to the substrate W. The stirring vane 619 comprises a plate having saw-toothed irregularities 619a in the form of successive triangular teeth on its one side facing the substrate W. The plating tank 611 has a plating solution supply port 621 for supplying the plating solution into the plating tank 611 and a plating solution discharge port 622 for discharging the plating solution out of the plating tank 611.

In the present embodiment, when the stirring vane 619 with the saw-toothed irregularities 619a on its one side facing the substrate W is reciprocally moved in directions parallel to the substrate W by the stirring mechanism 620, many swirls are produced uniformly and generally in the plating solution. Thus, the flow of the plating solution that is in contact with the surface (to be plated) of the substrate W is more uniformly and effectively applied to form a plated film having better film thickness uniformity, i.e., a plated film having a more uniform film thickness, on the surface of the substrate W.

Figures 17A, 17B, 17C:
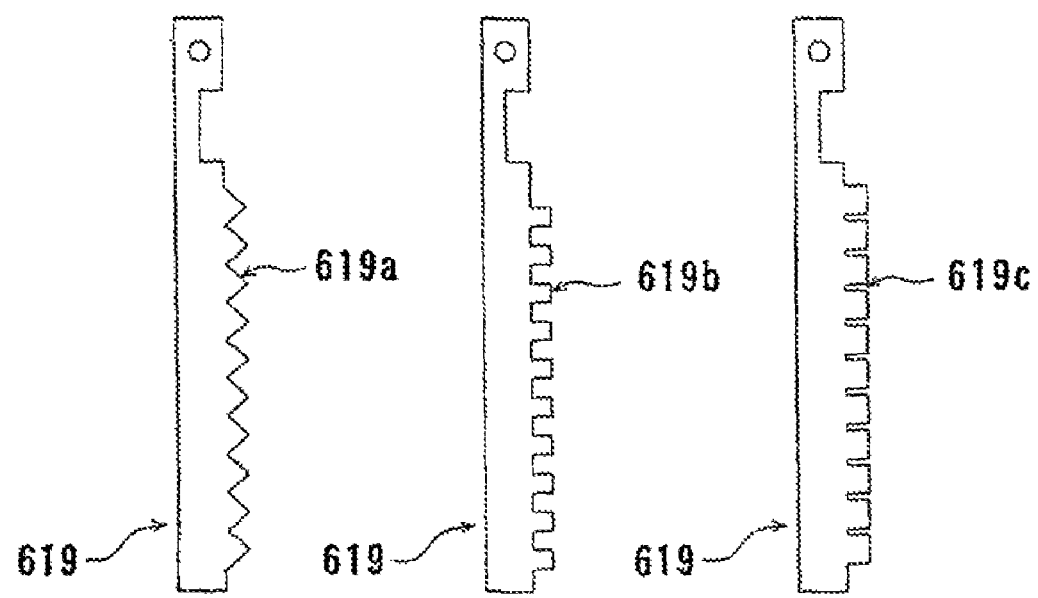
FIGS. 17A through 17C are views showing different shapes of stirring vanes, respectively.

In the above embodiment, the saw-toothed irregularities 619a in the form of successive triangular teeth are disposed on the side of the stirring vane 619 which faces the substrate W, as shown in FIG. 17A. However, the saw-toothed irregularities are not limited to those shown in FIG. 17A, but may be saw-toothed irregularities 619b in the form of successive rectangular teeth as shown in FIG. 17B, or irregularities 619c in the form of a number of narrow grooves defined at predetermined intervals as shown in FIG. 17C. Since the stirring vane 619 has, on one side thereof, the saw-toothed irregularities 619a in the form of successive triangular teeth, the saw-toothed irregularities 619b in the form of successive rectangular teeth, or the irregularities 619c in the form of a number of narrow grooves defined at predetermined intervals, the flow of the plating solution, which is caused by the reciprocating movement of the stirring vane 619, generates many swirls uniformly and generally in the plating solution. As the flow of the plating solution that is in contact with the substrate W is more uniformly and effectively applied, it is possible to form a plated film having better film thickness uniformity on the surface of the substrate W.

Figure 18:
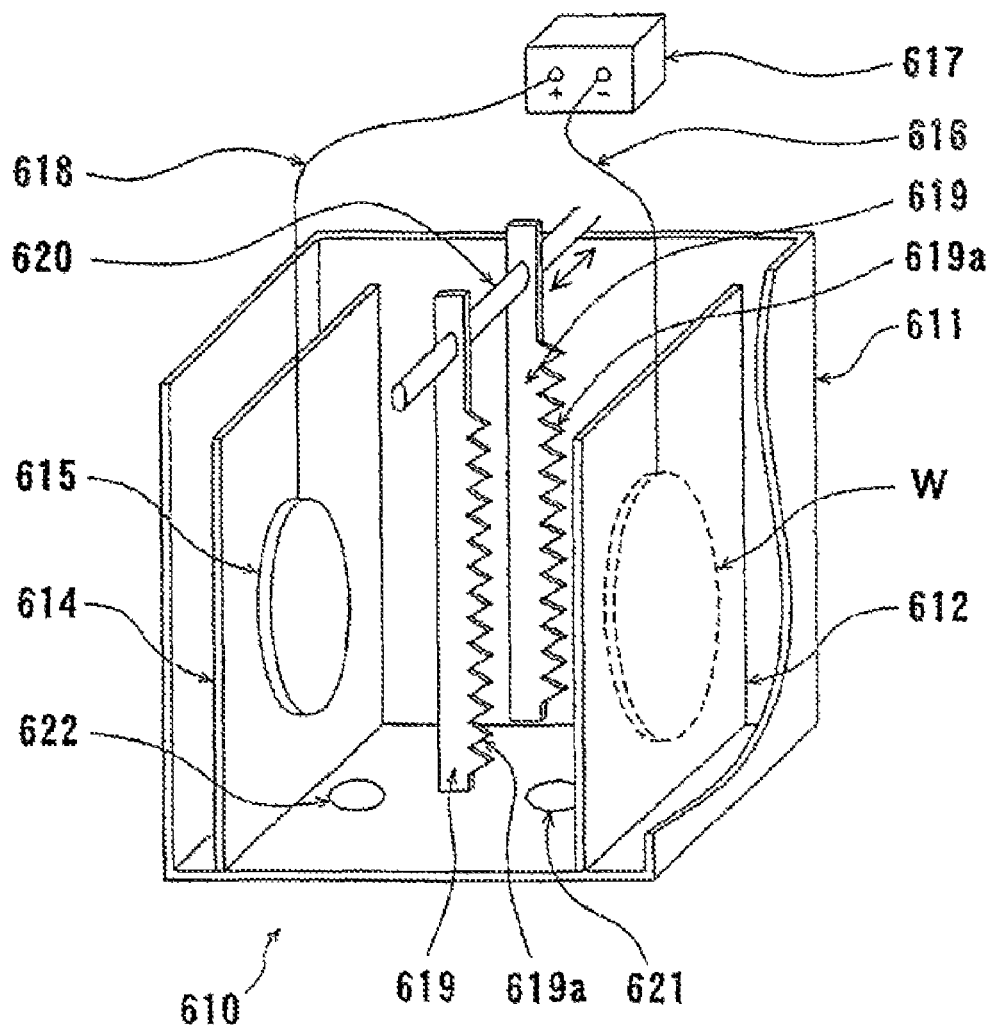
FIG. 18 is a schematic perspective view of a plating apparatus (electroplating apparatus) according to a yet another embodiment of the present invention.

FIG. 18 shows a plating apparatus (electroplating apparatus) according to yet another embodiment of the present invention. Those parts of the plating apparatus shown in FIG. 18, which are denoted by reference characters identical to those shown in FIG. 17, are identical or correspond to those parts shown in FIG. 17. This principle applies to other figures. As shown in FIG. 18, the stirring mechanism 620 of the plating apparatus 610 has a plurality of (two in FIG. 18) stirring vanes 619 each having saw-toothed irregularities 619a on its one side facing the substrate W. When the stirring vanes 619 of the stirring mechanism 620 are reciprocally moved parallel to the substrate W, many swirls are produced uniformly and generally in the plating solution. Thus, the flow of the plating solution that is in contact with the substrate W is more uniformly and effectively applied to form a plated film having better film thickness uniformity on the surface (surface to be plated) of the substrate W. Each of the stirring vanes 619 may have either one of the irregularities 619a, 619b and 619c shown in FIGS. 17A through 17C.

Figure 19A:
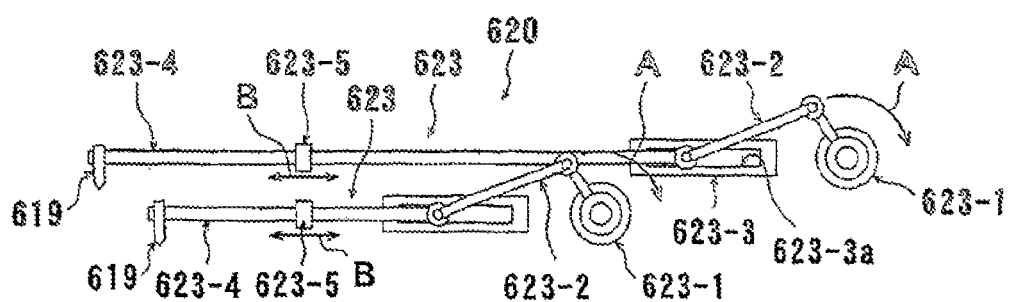
FIG. 19A is a plan view of another stirring mechanism.
Figure 19B:
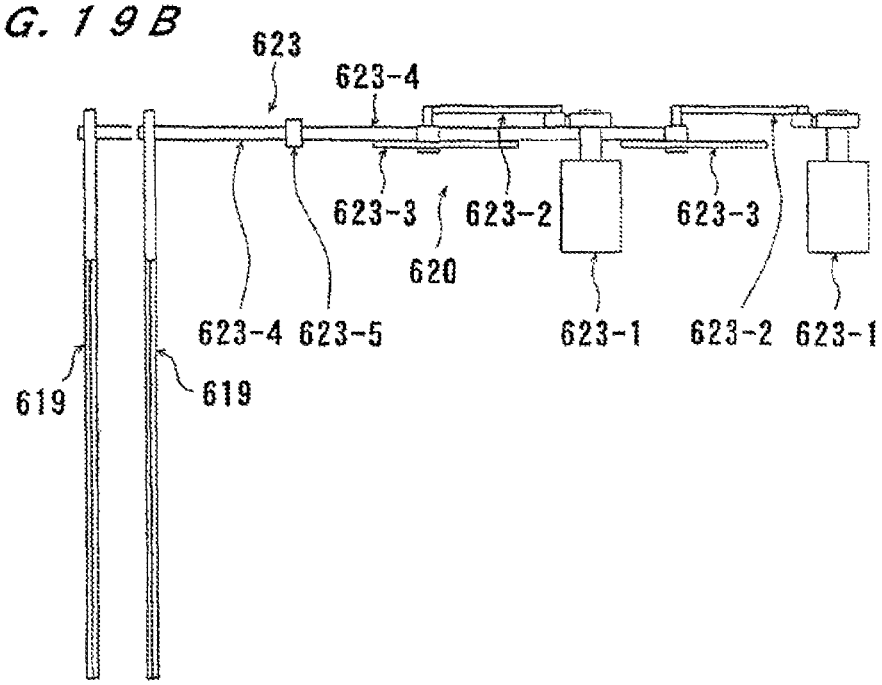
FIG. 19B is a front view of another stirring mechanism.

FIG. 19A is a plan view of another stirring mechanism, and FIG. 19B is a front view of the other stirring mechanism. As shown in FIGS. 19A and 19B, the stirring mechanism 620 has a plurality of (two in FIGS. 19A and 19B) stirring vanes 619 that are actuatable by respective independent drive mechanisms 623. Each of the drive mechanisms 623 comprises a drive motor 623-1, a crank 623-2, a guide member 623-3, a drive shaft 623-4, and a bearing 623-5. The stirring vane 619 is mounted on the distal end of the drive shaft 623-4. As shown in FIG. 16, the stirring vanes 619 extend substantially vertically from the upper portion toward the bottom of the plating tank 611.

When the drive motor 623-1 is energized to rotate as indicated by the arrow A, the crank 623-2, which has an end coupled to the drive shaft of the drive motor 623-1, has its other end reciprocally moved along a guide groove 623-3a defined in the guide member 623-3. The drive shaft 623-4, which is connected to the other end of the crank 623-2 and supported by the bearing 623-5, is reciprocally moved as indicated by the arrow B, thereby reciprocally moving the stirring vane 619 that is mounted on the distal end of the drive shaft 623-4.

As described above, the stirring mechanism 620 has the plural (two in FIGS. 19A and 19B) stirring vanes 619 that are actuatable by the respective independent drive mechanisms 623. When the stirring vanes 619 are actuatable by the respective independent drive mechanisms 623, the stirring distribution of the plating solution can be adjusted to form a plated film having better film thickness uniformity on the surface (to be plated) of the substrate W.

Figures 20A, 20B:
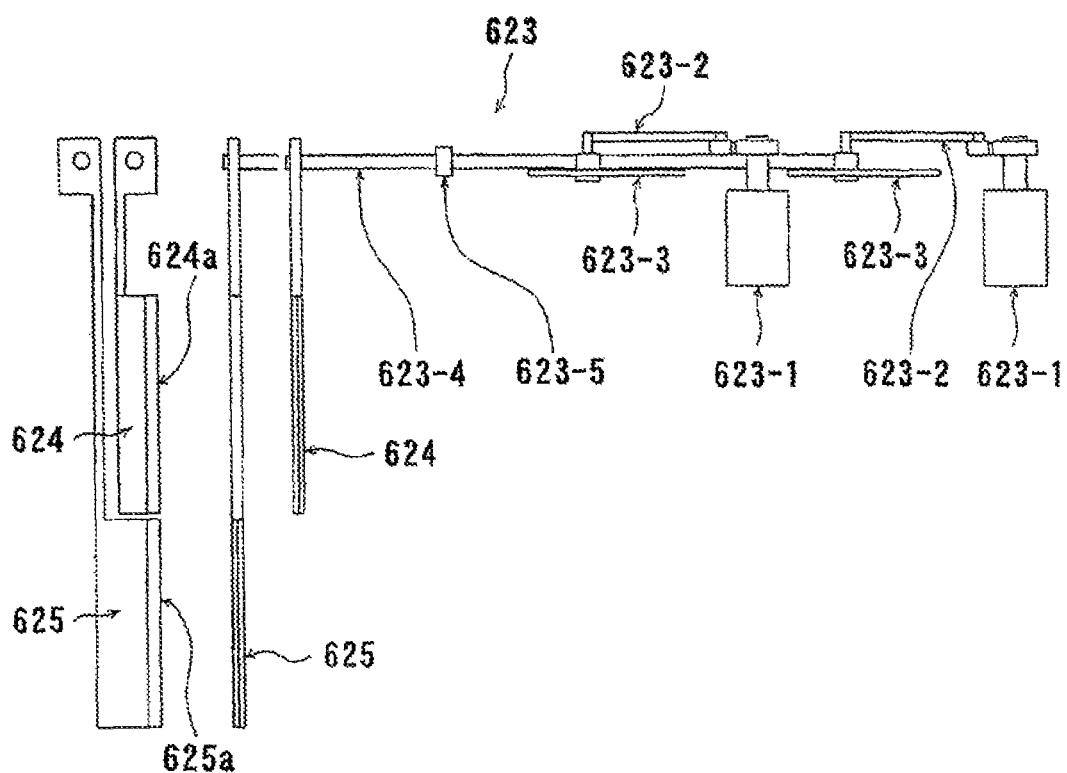
FIG. 20A is a side view of still another stirring mechanism.
FIG. 20B is a front view of the still another stirring mechanism.

The stirring vanes 619 mounted on the drive mechanisms 623 of the stirring mechanism 620 shown in FIGS. 19A and 19B are identical in shape to each other. However, the stirring vanes may have different shapes. Specifically, FIGS. 20A and 20B show a stirring mechanism having vertically extending stirring vanes 624, 625 which are substantially equal in length to each other and having respective independent drive mechanisms 623. The stirring vanes 624, 625 have respective edges 624a, 625a on their one sides which are aligned with each other to keep the stirring surfaces of the stirring vanes 624, 625 in alignment with each other, so that the stirring vanes 624, 625 can stir the plating solution in vertically different regions. FIGS. 21A and 21B show a stirring mechanism having a longer stirring vane 632 and a shorter stirring vane 634 that are disposed in upper and lower positions, respectively, and are reciprocally moved by respective independent drive mechanisms 623. The stirring vanes 632, 634 have respective edges 632a, 634a on their one sides which are aligned with each other to keep the stirring surfaces of the stirring vanes 632, 634 in alignment with each other, so that the stirring vanes 632, 634 can stir the plating solution in vertically different regions. By thus selectively using stirring vanes having different shapes, the stirring distribution of the plating solution can be adjusted to form a plated film having better uniformity on the surface of the substrate W.

Figure 22:
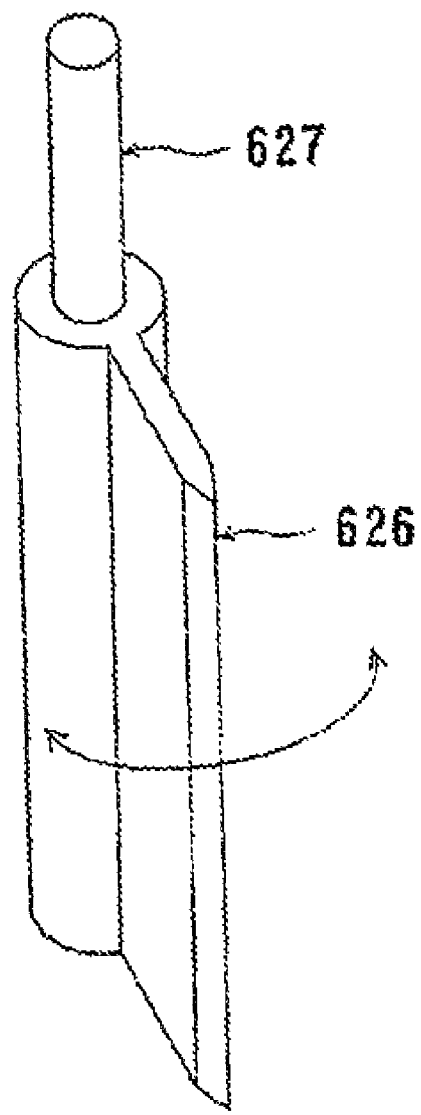
FIG. 22 is a perspective view of yet another stirring vane.

FIG. 22 shows still another stirring vane. As shown in FIG. 22, a stirring vane 626 is mounted on a rotational shaft 627 which is angularly movable to change the angle of the stirring vane 626. As shown in FIGS. 23 and 24, for example, a plurality of (three as shown) such stirring vanes 626 are mounted on a reciprocally movable drive mechanism (e.g., the drive mechanism 623 shown in FIGS. 19A and 19B). The stirring vanes 626 are reciprocally moved parallel to a surface (to be plated) Wa of the substrate W as indicated by the arrow D shown in FIG. 23 or the arrow C shown in FIG. 24, and the rotational shafts 627 are angularly moved as the direction in which the stirring vanes 626 are moved is changed, thus changing the angle of the stirring vanes 626 with respect to the substrate W.

As described above, when the stirring vane 626 shown in FIG. 22 is used as the stirring vanes of the stirring mechanism and the angle of the stirring vanes 626 with respect to the substrate W is changed as the direction in which the stirring vanes 626 are moved is changed, as shown in FIGS. 23 and 24, a flow is caused in the plating solution as indicated by the arrow F shown in FIG. 23 or the arrow E shown in FIG. 24. The flow of the plating solution thus produced by the motion of the stirring vanes 626 is generated uniformly and generally, applying the plating solution uniformly and effectively to the surface to be plated of the substrate W thereby to form a plated film having better film thickness uniformity on the surface of the substrate W. In particular, since the plural stirring vanes 626 are employed, a flow of the plating solution is produced more uniformly and generally near the surface Wa of the substrate W thereby to form a plated film of better film thickness uniformity on the surface Wa of the substrate W.

Figure 25:
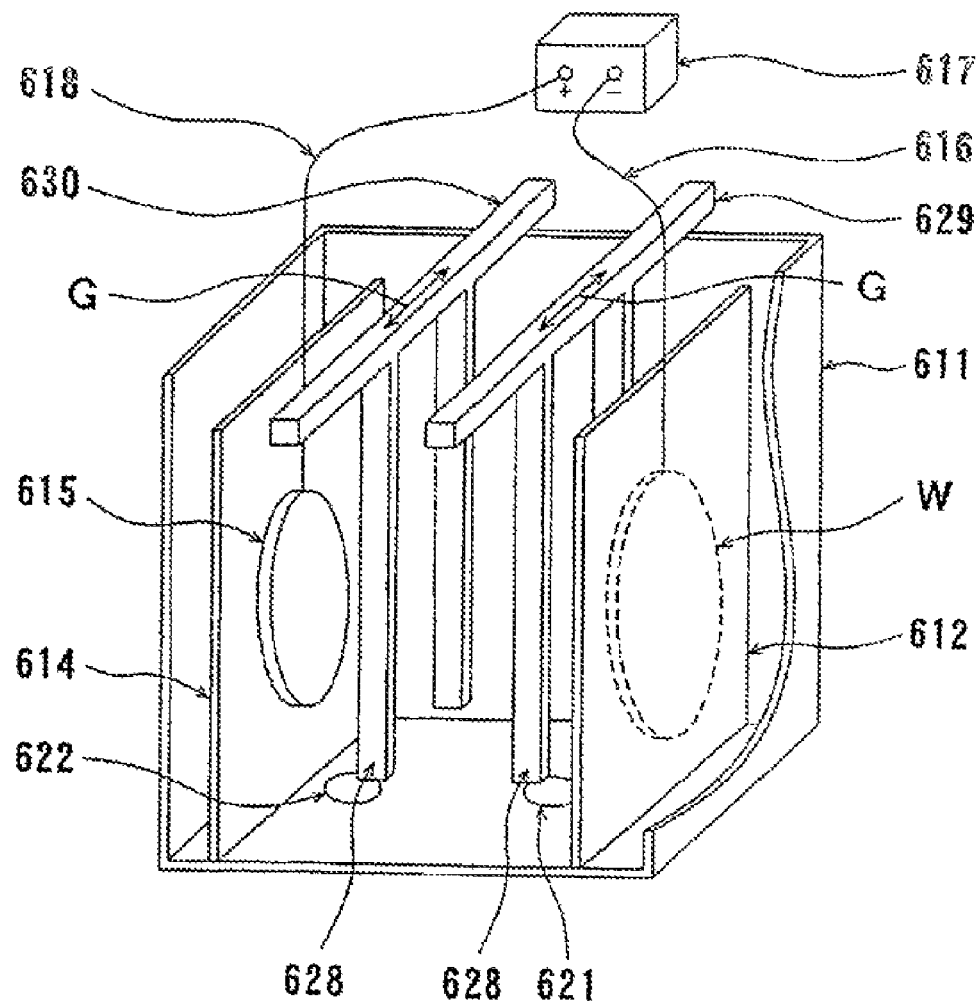
FIG. 25 is a schematic perspective view of a plating apparatus (electroplating apparatus) according to yet another embodiment of the present invention.
Figure 27:
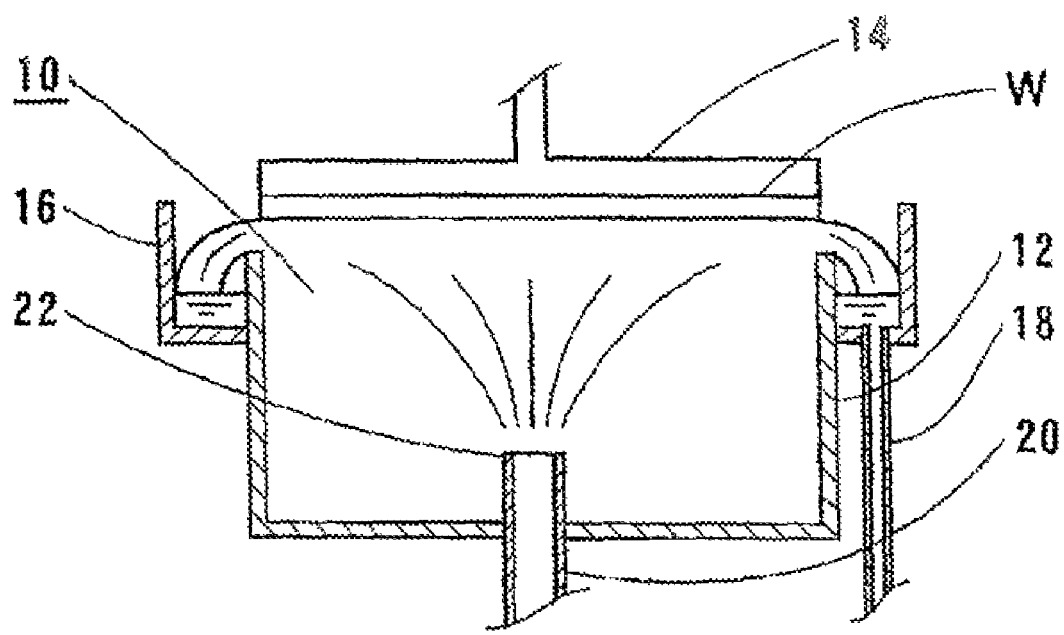
FIG. 27 is a schematic cross-sectional view of a conventional plating apparatus (electroless plating apparatus)
Figure 28:
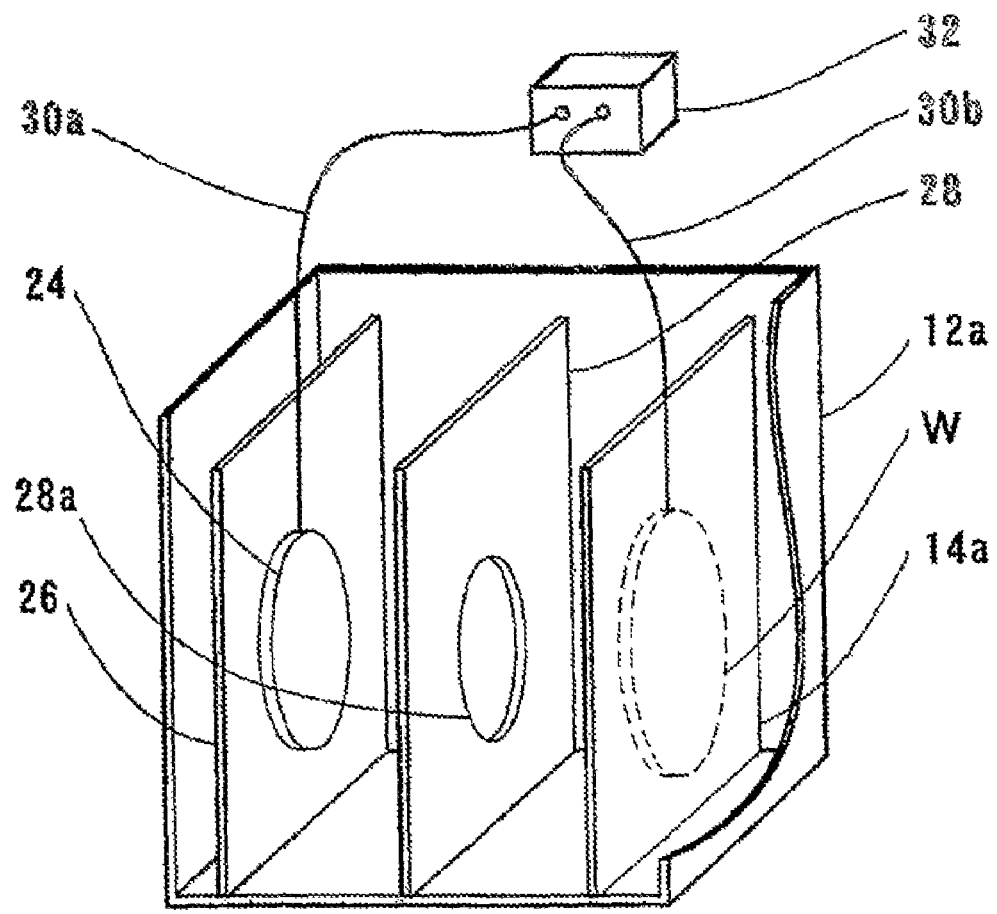
FIG. 28 is a schematic cross-sectional view of a conventional plating apparatus (electroplating apparatus)
Figure 29:
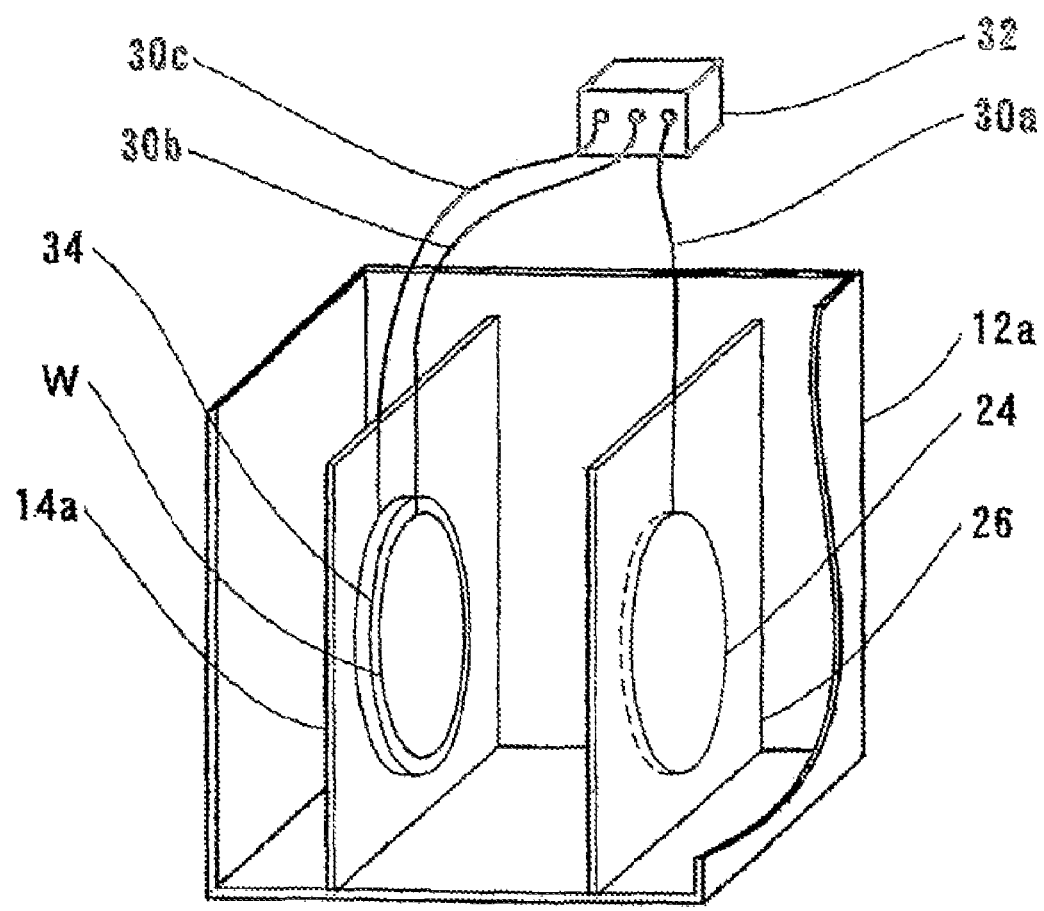
FIG. 29 is a schematic cross-sectional view of another conventional plating apparatus (electroplating apparatus)
Figure 30:
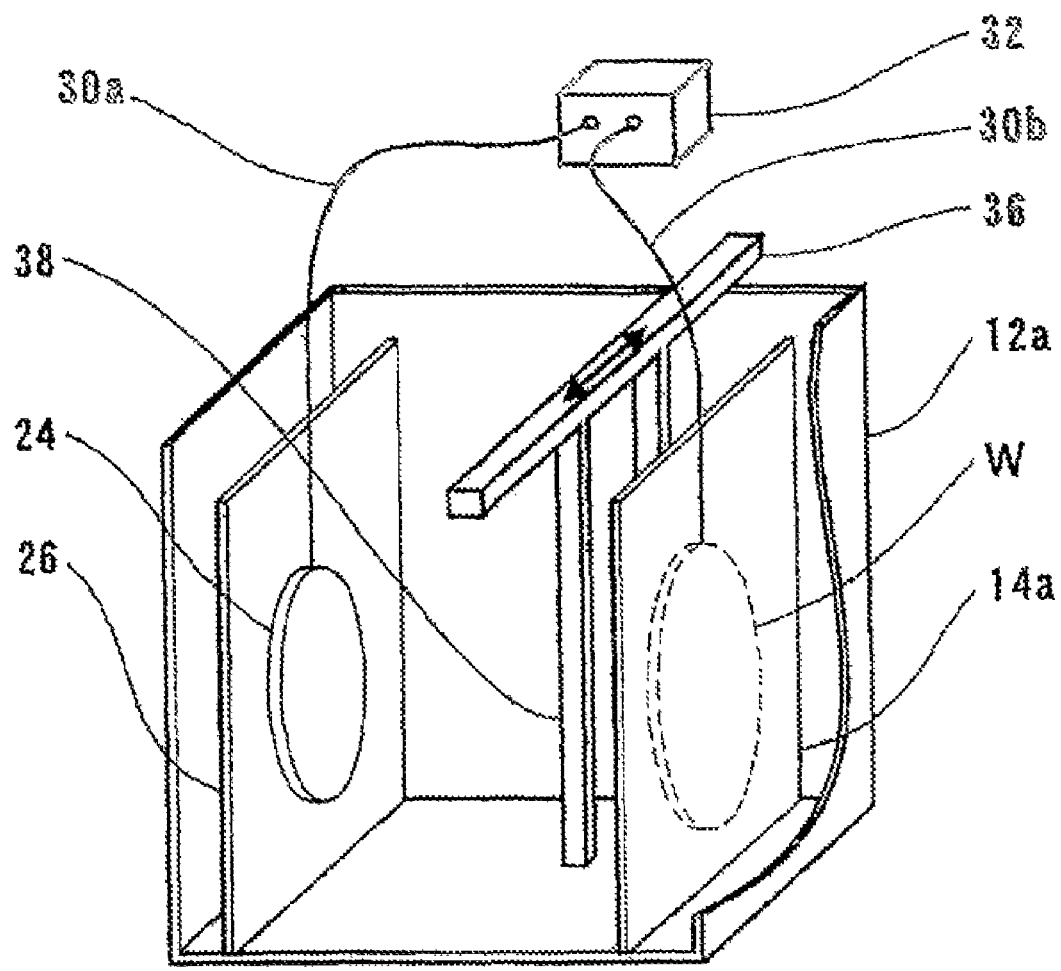
FIG. 30 is a schematic cross-sectional view of still another conventional plating apparatus (electroplating apparatus).

FIG. 25 shows a plating apparatus (electroplating apparatus) according to yet another embodiment of the present invention. As shown in FIG. 25, the plating apparatus has two opposing stirring mechanisms 629, 230 having respective stirring vanes 628 and disposed between a substrate W and an anode 615 which are disposed opposing to each other in a plating tank 611. One of the stirring mechanisms 629 is disposed close to the substrate W, and the other stirring mechanism 630 is disposed close to the anode 615. A flow of the plating solution which brings into contact with both the substrate W and the anode 615 is more uniformly and effectively applied by the stirring vane 628 (first stirring vane) of the stirring mechanism 629 and the stirring vane 628 (second stirring vane) of the stirring mechanism 630, for thereby forming a plated film of better uniformity on the surface of the substrate W.

In the plating apparatus shown in FIG. 25, the stirring vanes 628, 628 of the stirring mechanisms 629, 630 are free of irregularities on their sides facing the substrate W and the anode 615. However, as shown in FIG. 26, stirring vanes 619 having saw-toothed irregularities 619a in the form of successive triangular teeth, as shown in FIG. 17A, on their one sides facing the substrate W and the anode 615 may be mounted on the stirring mechanisms 629, 630. Alternatively, each of the stirring vanes 619 may have saw-toothed irregularities 619b in the form of successive rectangular teeth as shown in FIG. 17B, or irregularities 619c in the form of a number of narrow grooves defined at predetermined intervals as shown in FIG. 17C.

In the plating apparatus shown in FIGS. 25 and 26, the stirring mechanisms 629, 630 may be reciprocally moved in unison with each other or separately from each other, as indicated by the arrows G shown in FIG. 25.

Although embodiments of the present invention have been described above, the present invention is not limited to the above embodiments, but various changes and modifications may be made therein within the scope of the technical concept described in the scope of the claims, and the specification and drawings. Any configurations, structures, and materials which are not directly described in the specification and drawings fall within the scope of the technical concept of the present invention insofar as they operate and offer the advantages according to the present invention.

The present invention is concerned with a plating apparatus for plating a surface of a substrate, and more particularly with a plating apparatus for use in forming a plated film in trenches, via holes, or resist openings that are defined in a surface of a semiconductor wafer, and forming bumps to be electrically connected to electrodes of a package, on a surface of a semiconductor wafer.

The invention claimed is:

1. An electroplating method for plating a workpiece having a surface to be plated using a plating solution, the electroplating method comprising:

holding a plating solution in a plating tank;

arranging an anode in the plating tank so as to be immersed in the plating solution held in the plating tank;

holding the workpiece by a holder and bringing the surface of the workpiece into contact with the plating solution held in the plating tank;

arranging a fixing plate, having an opening therein, so as to divide an interior of the plating tank into an anode compartment accommodating the anode and a workpiece compartment accommodating the workpiece held by the holder;

injecting the plating solution toward the surface of the workpiece held by the holder to supply the plating solution into the plating tank from a plurality of injection nozzles formed on a ring-shaped nozzle pipe which is fixed to the fixing plate in the plating tank so as to be immersed in the plating solution held in the plating tank, the nozzle pipe being shaped to extend along an outer profile of the workpiece; and applying a plating voltage between the anode and the workpiece to perform electroplating on the surface of the workpiece.

2. An electroplating method according to claim 1, wherein the plating solution is injected in streams from the injection nozzles, and wherein the streams of the plating solution injected from the injection nozzles intersect each other on or in front of a substantially central area of the surface of the workpiece held by the holder.

3. An electroplating method according to claim 1, further comprising injecting the plating solution from a plating solution injection nozzle toward the anode to supply the plating solution into the plating tank.

4. An electroplating method according to claim 1, wherein the nozzle pipe is movable relative to the workpiece held by the holder.

5. An electroplating method according to claim 1, wherein the nozzle pipe and/or the injection nozzles are made of an electrically insulating material.

6. An electroplating method according to claim 1, wherein the injection nozzles of the nozzle pipe are spaced apart along an annular axis of the nozzle pipe.

7. An electroplating method according to claim 1, further comprising arranging a regulation plate, having a central hole, in the plating tank between the ring-shaped nozzle pipe and the workpiece held by the holder.

8. An electroplating method according to claim 1, further comprising moving a stirring in the plating tank between the ring-shaped nozzle pipe and the substrate held by the holder reciprocally parallel to the surface of the substrate for stirring the plating solution held in the plating tank.

9. An electroplating method according to claim 1, wherein the opening of the fixing plate has a size no larger than an inside diameter of the ring-shaped nozzle pipe.

10. A plating method for plating a workpiece having a surface to be plated using a plating solution, the plating method comprising:

holding a plating solution in a plating tank; and immersing a plurality of stirring vanes, having stirring surfaces, in the plating solution in the plating tank for stirring the plating solution, wherein the plurality of stirring vanes extend vertically within the plating tank and are actuatable by respective independent drive mechanisms each having an independent drive source, the plurality of stirring vanes having respective tip ends which are aligned with each other such that distances between stirring surfaces of the plurality of stirring vanes and the surface of the substrate become equal.

11. A plating method according to claim 10, wherein stirring vanes of the plurality of stirring vanes are different in shape from each other.

12. A plating method according to claim 10, wherein the plurality of stirring vanes are reciprocally movable in directions parallel to the surface of the workpiece.

13. A plating method for plating a workpiece having a surface to be plated using a plating solution, the plating method comprising:

holding a plating solution in a plating tank; and immersing a stirring mechanism, having a stirring vane, in the plating solution in the plating tank and disposing in a position facing the surface of the workpiece, the stirring vane being mounted on a rotational shaft and reciprocally movable parallel to the surface of the workpiece to stir the plating solution, wherein the stirring vane is oriented such that a plane of the stirring vane forms an angle with respect to a plane perpendicular to the surface of the workpiece, the stirring mechanism being operable to vary the angle of the plane of the stirring vane with respect to the plane perpendicular to the surface of the workpiece as the stirring vane reciprocally moves by angular movement of the rotational shaft about the longitudinal axis of the rotational shaft.

14. A plating method according to claim 13, wherein the stirring mechanism has a plurality of stirring vanes.

* * * * *